(12) United States Patent
Park et al.

(10) Patent No.: US 6,891,916 B2
(45) Date of Patent: May 10, 2005

(54) SHIFT REGISTER WITH BUILT-IN LEVEL SHIFTER

(75) Inventors: Jae Deok Park, Kyoungsankbuk-do (KR); Du Hwan Oh, Chungju-shi (KR)

(73) Assignee: LG. Philips LCD Co., Ltd., Seoul (KR)

(*) Notice: Subject to any disclaimer, the term of this patent is extended or adjusted under 35 U.S.C. 154(b) by 1 day.

(21) Appl. No.: 10/464,732

(22) Filed: Jun. 19, 2003

(65) Prior Publication Data

US 2004/0109526 A1 Jun. 10, 2004

(30) Foreign Application Priority Data

Dec. 4, 2002 (KR) .............................. 10-2002-0076543

(51) Int. Cl.[7] .............................................. G11C 19/00
(52) U.S. Cl. ............................ 377/68; 377/75; 377/79; 345/99; 345/100
(58) Field of Search .............................. 377/68, 75, 79; 345/99, 100

(56) References Cited

U.S. PATENT DOCUMENTS

| | | | | |
|---|---|---|---|---|
| 5,016,263 A | * | 5/1991 | Kitagawa et al. | ............. 377/68 |
| 6,301,323 B1 | * | 10/2001 | Czechanowski | ............. 377/54 |
| 6,483,889 B2 | * | 11/2002 | Kim et al. | ............. 377/54 |

* cited by examiner

Primary Examiner—Margaret R. Wambach
(74) Attorney, Agent, or Firm—McKenna Long & Aldridge LLP

(57) ABSTRACT

A shift register having a built-in level shifter includes a buffer outputting a shift pulse using a first clock signal and a first supply voltage via voltages at first and second nodes; a first controller controlling the voltage of the first node via the start pulse and the second node; and a second controller controlling the second node voltage using the first and second supply voltage via the start pulse and the second clock signal. The level shifter includes a third controller forming a current path between third supply voltage input line and first supply voltage input line controlling a third node using the first supply voltage and a third supply voltage via the voltage of the second node and two of first to fourth clock signals; and an output part outputting the level-shifted shift pulse using the first and third supply voltage via the voltage at the third node.

29 Claims, 16 Drawing Sheets

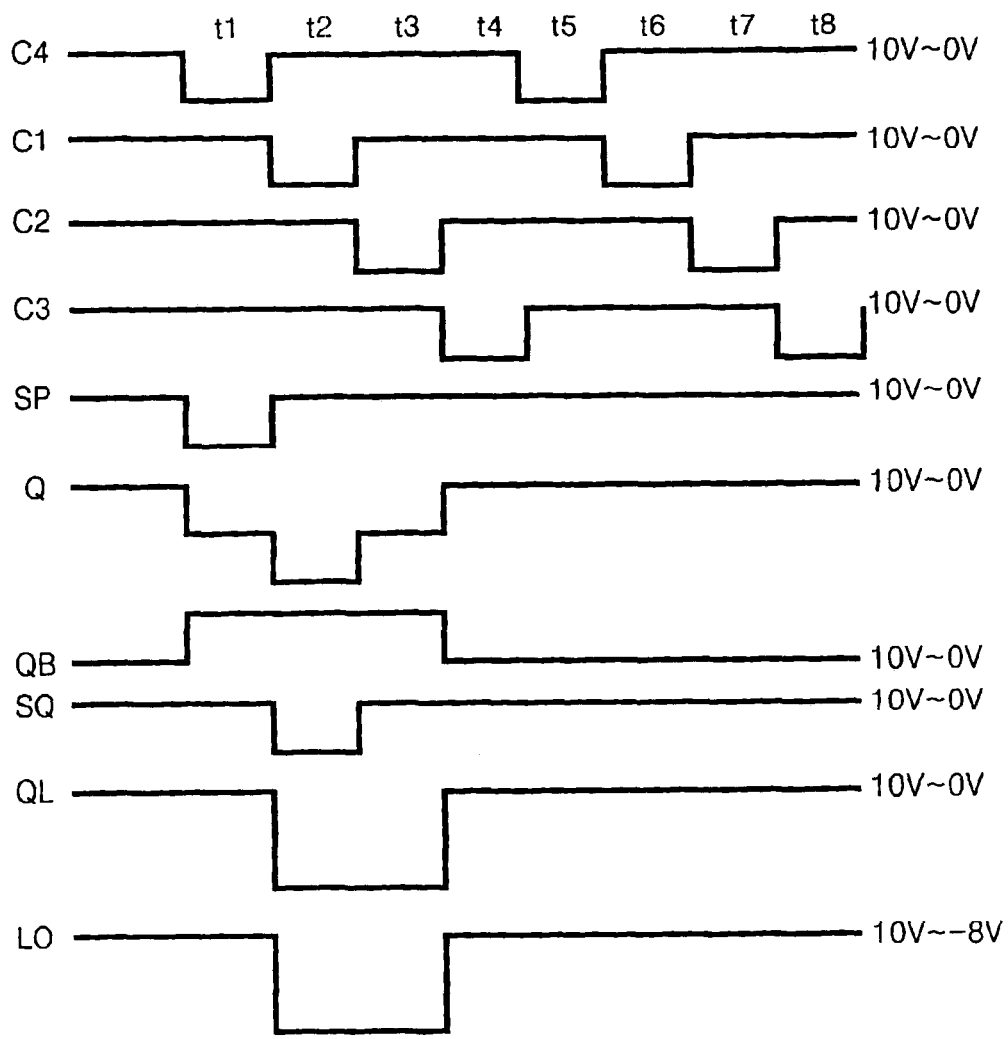

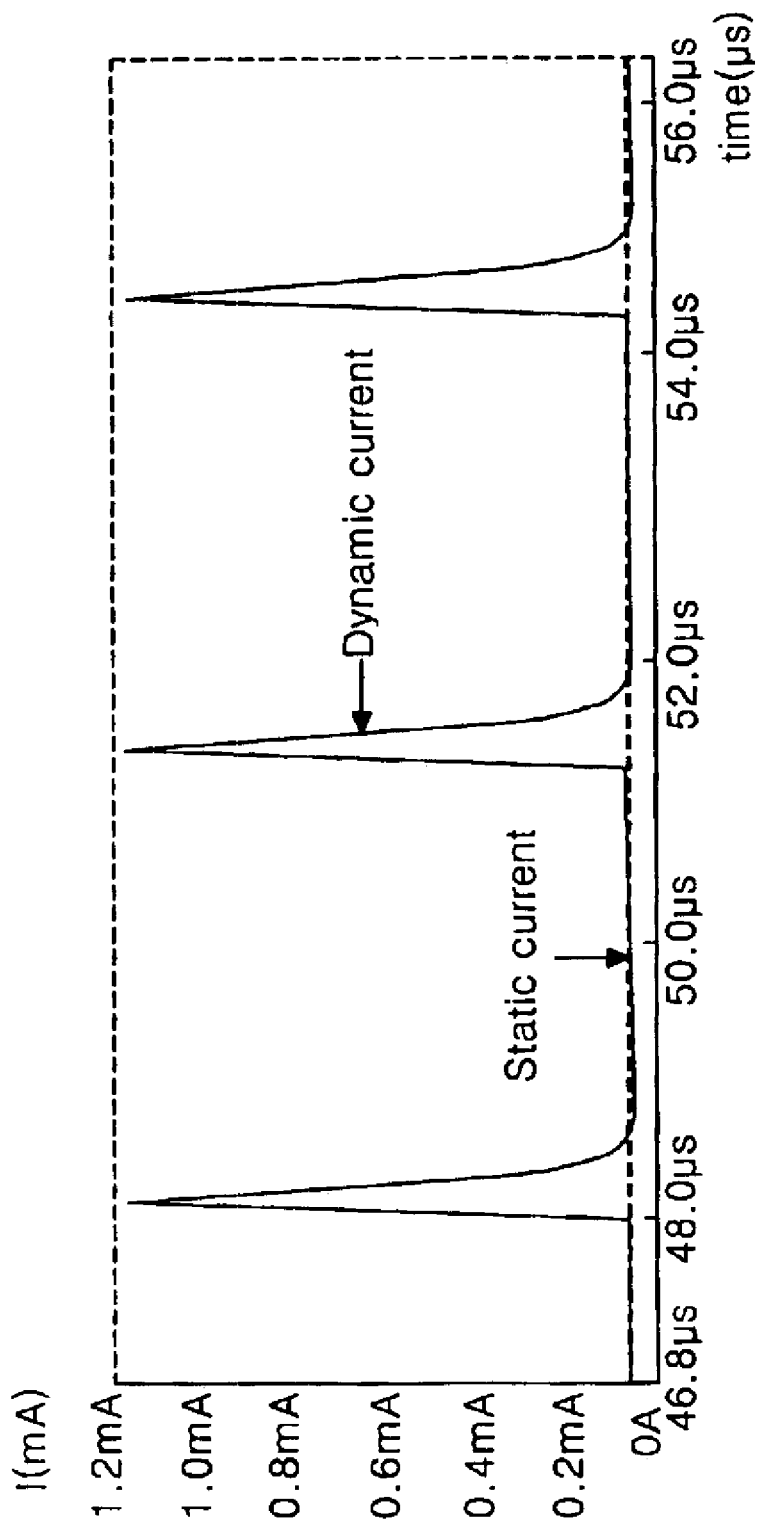

SHIFT REGISTER WITH BUILT-IN LEVEL SHIFTER

This application claims the benefit of Korean Patent Application No. 2002-76543, filed on Dec. 4, 2002, which is hereby incorporated by reference for all purposes as if fully set forth herein.

BACKGROUND OF THE INVENTION

1. Field of the Invention

The present invention relates to a shift register circuit, and more particularly to a shift register incorporating a built-in level shifter that is capable of reducing power dissipation, wherein the level shifter includes thin film transistors having the same channel type.

2. Description of the Related Art

Generally, liquid crystal displays (LCDs) express images using electric fields to control the light transmittance characteristics of liquid crystal material. Accordingly, LCDs include a liquid crystal display panel having liquid crystal cells arranged in a matrix pattern and a driving circuit for driving the liquid crystal display panel.

Gate lines and data lines are arranged within the liquid crystal display panel to cross each other. Liquid crystal cells are arranged at crossings of the gate and data lines. Liquid crystal display panels include pixel electrodes and a common electrode that apply electric fields to each of the liquid crystal cells. Each pixel electrode is connected to a corresponding data line via source and drain terminals of a switching device such as a thin film transistor (TFT). A gate terminal of each of the thin film transistors is connected to a corresponding gate line.

Driving circuits include a gate driver for driving the gate lines and a data driver for driving the data lines. The gate driver sequentially drives the liquid crystal cells on the liquid crystal display panel by sequentially applying a scanning signal to the gate lines. When the gate lines are supplied with the scanning signal, the data driver applies a video signal to respective ones of the data lines. Pictures are displayed by applying an electric field between pixel electrodes of each of the liquid crystal cells in the LCD panel and the common electrode. Electric fields are applied in accordance with inputted video signals.

Depending upon whether a semiconductor layer in the TFT is amorphous silicon or polycrystalline silicon, TFTs used in LCDs are classified as being either amorphous silicon type TFTs or polycrystalline silicon type TFTs.

LCDs fabricated using amorphous silicon type TFTs have a relatively low pixel density because amorphous silicon has a relatively small charge mobility. Moreover, use of amorphous silicon type TFTs in LCDs is disadvantageous because fabricating gate and data drivers out of amorphous silicon tends to be expensive and the time required to fabricate LCDs using amorphous silicon type TFTs tends to be lengthy due to their need to be manufactured separately from, and mounted onto the liquid crystal display panel.

LCDs fabricated using polycrystalline silicon type TFTs have a relatively high pixel density because polycrystalline silicon has a relatively high charge mobility. Moreover, use of polycrystalline silicon type TFTs in LCDs is advantageous because they decrease the manufacturing cost of the gate and data drivers due to their ability to be formed with peripheral driving circuits buried and mounted in the liquid crystal display panel. Accordingly, an LCD employing polycrystalline silicon type TFTs will now be discussed in greater detail below.

FIG. 1 illustrates a schematic view of a related art LCD employing polycrystalline silicon type TFTs.

Referring to FIG. 1, the LCD includes a liquid crystal display panel 10 including a picture display area 12, a data shift register 14, a gate shift register 16, a sampling switching array 15, a printed circuit board PCB 20 supporting an integrated control chip 22 containing control circuitry and a data driver IC and a level shifter array 24 mounted on PCB 20, and a flexible printed circuit FPC film 18 connecting the liquid crystal display panel 10 to the PCB 20.

The picture display area 12 includes a plurality of liquid crystal cells (LCs) arranged in a matrix pattern and is capable of displaying a picture. Each of the liquid crystal cells LC includes a switching device such as a polycrystalline silicon type TFT arranged at a crossing of a gate line GL and a data line DL. As polycrystalline silicon TFTs have a charge mobility roughly a hundred times larger than that of amorphous silicon TFTs, polycrystalline silicon TFTs have a relatively fast response speed such that the liquid crystal cells LC are driven in a point sequence manner. The data lines DL receive video signals from the sampling switch array 15, driven by the data shift register 14. The gate lines GL receive scanning signals from the gate shift register 16.

Both the data shift register 14 and gate shift register 16 include a plurality of stages. The output terminals of stages in the data shift register 14 are connected to respective ones of sampling switches of the sampling switch array 15 while the output terminals of stages in the gate shift register 16 are connected to respective ones of the gate lines GL. FIG. 2 illustrates the plurality of stages included within the data and gate shift registers 14 and 16. Generally, the plurality of stages are connected in cascade and shift a source start pulse from the control chip 22. In the data shift register 14, the plurality of stages sequentially apply sampling signals to the sampling switches while, in the gate shift register 16, the plurality of stages sequentially apply scanning pulses to the gate lines GL.

Referring to FIG. 2, the stages ST1 to STn are connected to an input line of a start pulse SP in cascade in addition to three of four phase clock signal supplying lines (C1 to C4). The four phase clock signals C1 to C4 are sequentially applied in a phase-delayed manner by one clock (as shown in FIG. 3). Each of the stages ST1 to STn shifts the start pulse SP by one clock with the aid of three clock pulses from the first to fourth clock signals C1 to C4 and outputs the shifted start pulse SP. Signals SO1 to SOn are outputted from each of the stages ST1 to STn of the shift register, applied as sampling signals to the sampling switches, and applied as start pulses for each succeeding stage.

The sampling switch array 15 includes a plurality of sampling switches (not shown) driven by sampling signals outputted from the data shift register 14 a plurality of output terminals connected to corresponding ones of the data lines DL. The sampling switches sequentially sample video signals from the control chip 22 in response to the outputted sampling signal and apply the sampled video signals to the data lines DL.

Because polycrystalline silicon is used in fabricating the TFTs, components of the liquid crystal display panel 10 such as the picture display area 12, the data shift register 14, the sampling switching array 15, and the gate shift register 16 are formed concurrently. LCDs fabricated using TFTs having P and N channels (i.e., CMOS TFTs) beneficially have a driving voltage with a wide range and are used to form simple integrated circuits. The use of TFTs having P and N channels, however, is disadvantageous because manufacturing costs tend to be high and the device reliability is low because a number of processes are required. If the liquid crystal display panel 10 is fabricated using TFTs having only one type of channel (e.g., all P or all N-type channels), the cost of manufacturing the LCD can be reduced below what it costs to manufacture CMOS TFTs and a relatively high device reliability may be achieved because a reduced number of processes are required.

Referring back to FIG. 1, a control circuit (not shown) included within the control chip 22 sends externally inputted video data to the data driver IC (not shown) and provides driving control signals required by the data and gate shift register 14 and 16, respectively. The data driver IC (not shown) converts the video data outputted by the control circuit (not shown) into an analog video signal and applies the analog video signal to the sampling switch array 15 via the FPC film 18.

The level shifter array 24 increases swing widths of the driving control signals (e.g., clock signals, etc.) inputted from the control circuit (not shown) and applies the driving control signals having the increased swing widths to the data and gate shift registers 14 and 16, respectively. For example, the level shifter array 24 level-shifts a clock signal, outputted by the control circuit and having a swing voltage below 10V, such that the clock signal has a swing width of at least 10V (including a negative voltage) and outputs the level-shifted clock signal. The clock signal is level-shifted because a pulse having a swing width of at least 10V should be supplied to drive TFTs formed in the liquid crystal display panel 10.

If the liquid crystal display panel 10 includes PMOS thin film transistors, a driving pulse suitable for driving the PMOS thin film transistors included in the sampling switch array 15 and the picture display area 12 must have a swing width of at least 10V in a negative direction. In order to provide such a driving pulse, a pulse having a swing width of at least 10V in a negative direction must be applied to the gate and data shift registers 14 and 16 as a clock signal. Using the control chip 22, a clock signal having a swing width up to 10V may be easily produced, but a clock signal having a swing width greater than 10V or having a negative value is produced with difficulty. It is difficult to ensure device performance while generating a voltage having a swing width greater than 10V or having a negative voltage. Further, it is difficult to ensure device performance while manufacturing an IC on a single chip. Accordingly, in the LCD illustrated in FIG. 1, the level shifter array 24, used to level-shift a driving pulse of 10V into a driving pulse having a swing width of greater than 10V including a negative voltage, is provided as a separate chip mounted on the PCB 20. However, it is disadvantageous to mount external circuits to the PCB 20 because the PCB cannot be made compactly. Furthermore, a potentially excessive amount of power is consumed by the LCD since clock signals having both positive and negative voltages and having swing widths of at least 10V must be applied from the PCB 20 to the data shift register 14 and the gate shift register 16 of the liquid crystal display panel 10.

SUMMARY OF THE INVENTION

Accordingly, the present invention is directed to a shift register incorporating a built-in level shifter that substantially obviates one or more of the problems due to limitations and disadvantages of the related art.

An advantage of the present invention provides a shift register incorporating a built-in level shifter that is capable of reducing power dissipation, wherein the level shifter includes thin film transistors of a single channel type.

Another advantage of the present invention provides a shift register incorporating a built-in level shifter that is capable of reducing a minimum voltage level in an input signal required by thin film transistors of a single channel type while being capable of reducing power dissipation.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a shift register incorporating a built-in level shifter may, for example, include a plurality of stages connected in cascade for shifting start pulses applied to respective ones of input terminals and for sequentially outputting the start pulses; and a plurality of level shifters for level-shifting voltage levels of the start pulses outputted from the plurality of stages and for outputting the level-shifted voltage levels. Each of the plurality of stages may, for example, include a buffer for outputting a start pulse used in a first clock signal and for outputting a first supply voltage in accordance with voltages at first and second nodes; a first controller for controlling the voltage of the first node in accordance with the start pulse and the second node; and a second controller for controlling the voltage of the second node using the first and second supply voltage in accordance with the start pulse and a second clock signal. Each of the plurality of level shifters may, for example, include a third controller for forming a current path between an input line of a third supply voltage and an input line of the first supply voltage and for controlling a third node using the first supply voltage and the third supply voltage in accordance with the voltage of the second node and two clock signals selected from second clock to fourth clock signals; and an output part for outputting the level-shifted shift pulse use in the first and third supply voltage in accordance with the state of the voltage at the third node.

In one aspect of the present invention, the first controller may, for example, include a first transistor, having a first conduction path between the start pulse and the first node, and a first control electrode for controlling the first conduction path in accordance with the start pulse; a second transistor, having a second conduction path between an output terminal of the first transistor and the first node, and a second control electrode for second controlling the conduction path in accordance with the third clock signal; and a third transistor, having a third conduction path between the first node and an input line of the first supply voltage, and a third control electrode for controlling the conduction path in accordance with the voltage of the second node.

In one aspect of the present invention, the third transistor may be a dual transistor having a dual control electrode for controlling the third conduction path in accordance with the voltage of the second node.

In another aspect of the present invention, the second controller may, for example, include a fourth transistor, having a fourth conduction path between an input line of the second supply voltage and the second node, and a fourth control electrode for controlling the conduction path in accordance with the second clock signal; and a fifth transistor, having a fifth conduction path between the second node and the input line of the first supply voltage, and a fifth control electrode for controlling the conduction path in accordance with the start pulse.

In one aspect of the present invention, the fifth transistor may be a dual transistor having a dual control electrode for controlling the fifth conduction path in accordance with the start pulse.

In yet another aspect of the present invention, the buffer may, for example, include a sixth transistor, having a sixth conduction path between an input line of the first clock signal and an output line of the stage, and a sixth control electrode for controlling the conduction path in accordance with the voltage of the first node; and a seventh transistor, having a seventh conduction path between the output line of the stage and the input line of the first supply voltage, and a seventh control electrode for controlling the conduction path in accordance with the voltage of the second node.

In one aspect of the present invention, the buffer may further include a capacitor for bootstrapping the voltage of the sixth control electrode, wherein the capacitor may be connected between the sixth control electrode of the sixth transistor and the output line of the stage.

The stage may further include a capacitor for preventing the voltage of the second node from being distorted by a leakage current of the fifth transistor.

In still another aspect of the present invention, the third controller may, for example, include an eighth transistor, having an eighth conduction path between the input line of the third supply voltage and the third node, and an eighth control electrode for controlling the conduction path in accordance with the voltage of the first node; a ninth transistor, having a ninth conduction path between the third node and the input line of the first supply voltage, and a ninth control electrode for controlling the conduction path in accordance with the third clock signal; and a tenth transistor, having a tenth conduction path between the third node and the output line of the level shifter, and a tenth control electrode for controlling the conduction path in accordance with the second or fourth clock signal.

In one aspect of the present invention, the eighth transistor may be a dual transistor having a dual control electrode for controlling the eighth conduction path in accordance with the voltage of the first node.

In one aspect of the present invention, the output part may, for example, include an eleventh transistor, having an eleventh conduction path between the input line of the third supply voltage and the output line of the level shifter, and an eleventh control electrode for controlling the conduction path in accordance with the voltage of the third node; and a twelfth transistor, having a twelfth conduction path between the output line of the level shifter and the input line of the first supply voltage, and a twelfth control electrode for controlling the conduction path in accordance with the second clock signal or the fourth clock signal.

In one aspect of the present invention, if the tenth transistor and the twelfth transistor are controlled by the second clock signal, the level shifter may partially overlap with a preceding level shifter and output the level-shifted pulse.

In another aspect of the present invention, if the tenth transistor and the twelfth transistor are controlled by the fourth clock signal, the level shifter is synchronized with the pulse and outputs the level-shifted pulse.

In one aspect of the present invention, the level shifter may, for example, further include a thirteenth transistor, having a thirteenth conduction path between the third node and the output line of the level shifter, and a thirteenth control electrode for controlling the thirteenth conduction path in accordance with the voltage of the second node.

In another aspect of the present invention, the level shifter may, for example, further include a fourteenth transistor, having a fourteenth conduction path between the output line of the level shifter and the input line of the first supply voltage, and a fourteenth control electrode for controlling the fourteenth conduction path in accordance with the voltage of the second node.

In yet another aspect of the present invention, the level shifter further includes a fifteenth transistor, connected in as a diode between the input line of the third supply voltage and the eighth transistor.

In still another aspect of the present invention, the output part may, for example, include an eleventh transistor, having an eleventh conduction path between the input line of the third supply voltage and the output line of the level shifter, and an eleventh control electrode for controlling the conduction path in accordance with the voltage of the third node; and a twelfth transistor, having a twelfth conduction path between the output line of the level shifter and the input line of the first supply voltage, and a twelfth control electrode for controlling the twelfth conduction path in accordance with the voltage of the second node.

In still another aspect of the present invention, the level shifter may, for example, further include a thirteenth transistor, having a thirteenth conduction path between the third node and the output line of the level shifter, and a thirteenth control electrode for controlling the thirteenth conduction path in accordance with the voltage of the second node.

In still another aspect of the present invention, the level shifter may, for example, further include a fifteenth transistor connected as a diode between the input line of the third supply voltage and the eighth transistor.

In still another aspect of the present invention, the level shifter may, for example, further include a sixteenth transistor having a sixteenth conduction path between the output line of the level shifter and the input line of the first supply voltage, and a sixteenth control electrode for controlling the sixteenth conduction path in accordance with the third clock signal.

In one aspect of the present invention, the output part may for example, further include a capacitor for bootstrapping the voltage of the control electrode, wherein the capacitor may be connected between the eleventh control electrode of the eleventh transistor and the output line of the level shifter.

In one aspect of the present invention, the first supply voltage is greater than the second supply voltage and the second supply voltage is greater than the third supply voltage.

In another aspect of the present invention, the third supply voltage may be a negative voltage.

In still another aspect of the present invention, the first to fourth clock signals may be clock signals with phases delayed by one clock in order of the fourth clock signal, the first clock signal, the second clock signal, and the third clock signal. The fourth clock signal may have the same phase as the start pulse.

In one aspect of the present invention, the stages and the level shifters may comprise thin film transistors having only a single channel type.

In another aspect of the present invention, the stages and the level shifters may comprise only P-channel thin film transistors.

In still another aspect of the present invention, the level shifter may lower the minimum voltage level of the shift pulse to a level substantially equal to the third supply voltage and output the level shifted pulse.

In yet another aspect of the present invention, the shift register may be applied to at least any one of a gate driver for driving gate lines of a display device and a data driver for driving data lines of the display device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 10 illustrates input and output waveforms of the shift register shown in FIG. 9;

FIGS. 11A to 11C are the waveforms representing a static current by the fourteenth PMOS transistor shown in FIG. 9 and the distortion of a signal waveform and its power dissipation according to the channel width thereof.

DETAILED DESCRIPTION OF THE ILLUSTRATED EMBODIMENTS

Reference will now be made in detail to an embodiment of the present invention, example of which is illustrated in the accompanying drawings.

Referring to FIGS. 4–7, a shift register incorporating a built-in level shifter described by Korean patent applications P2001-78450 and P2002-65541, filed by the Applicants of the present invention, will be discussed.

Figure 1:
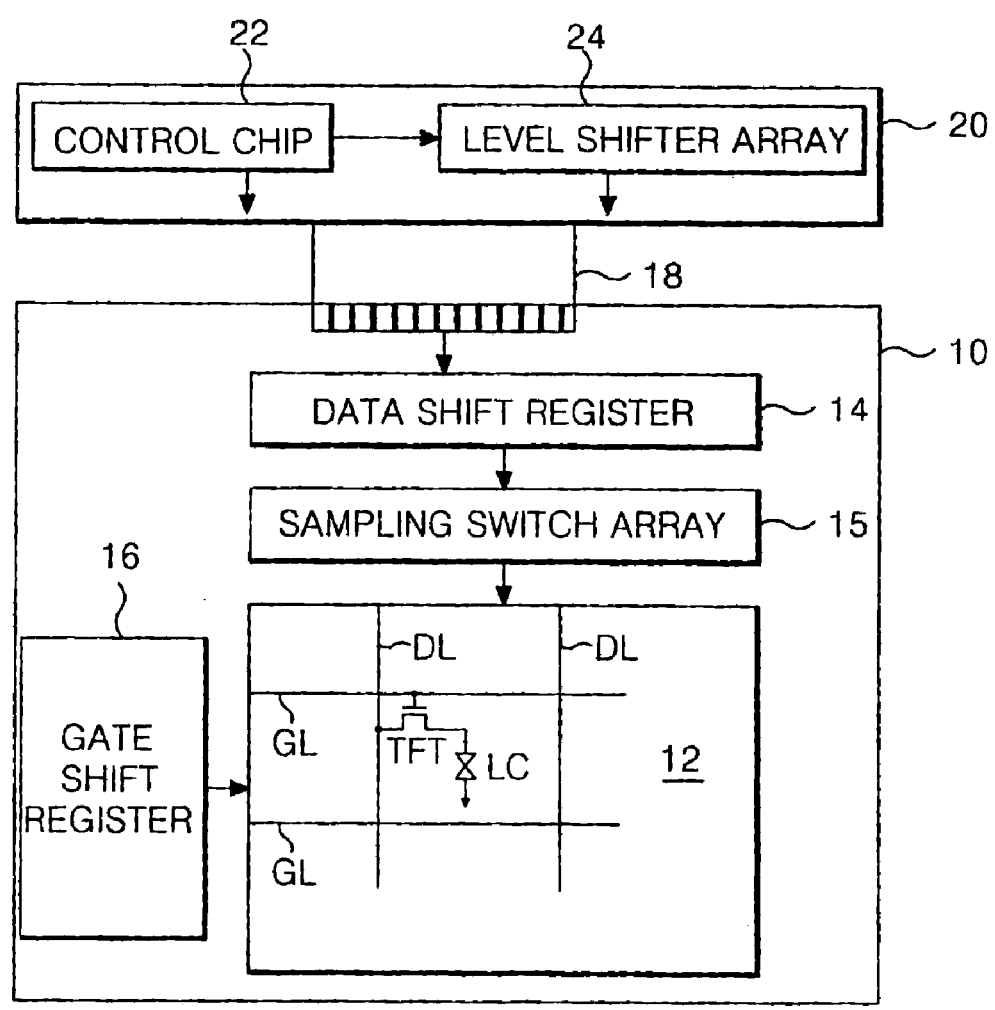
FIG. 1 illustrates schematic block diagram of a related art liquid crystal display employing polycrystalline silicon.
Figure 2:
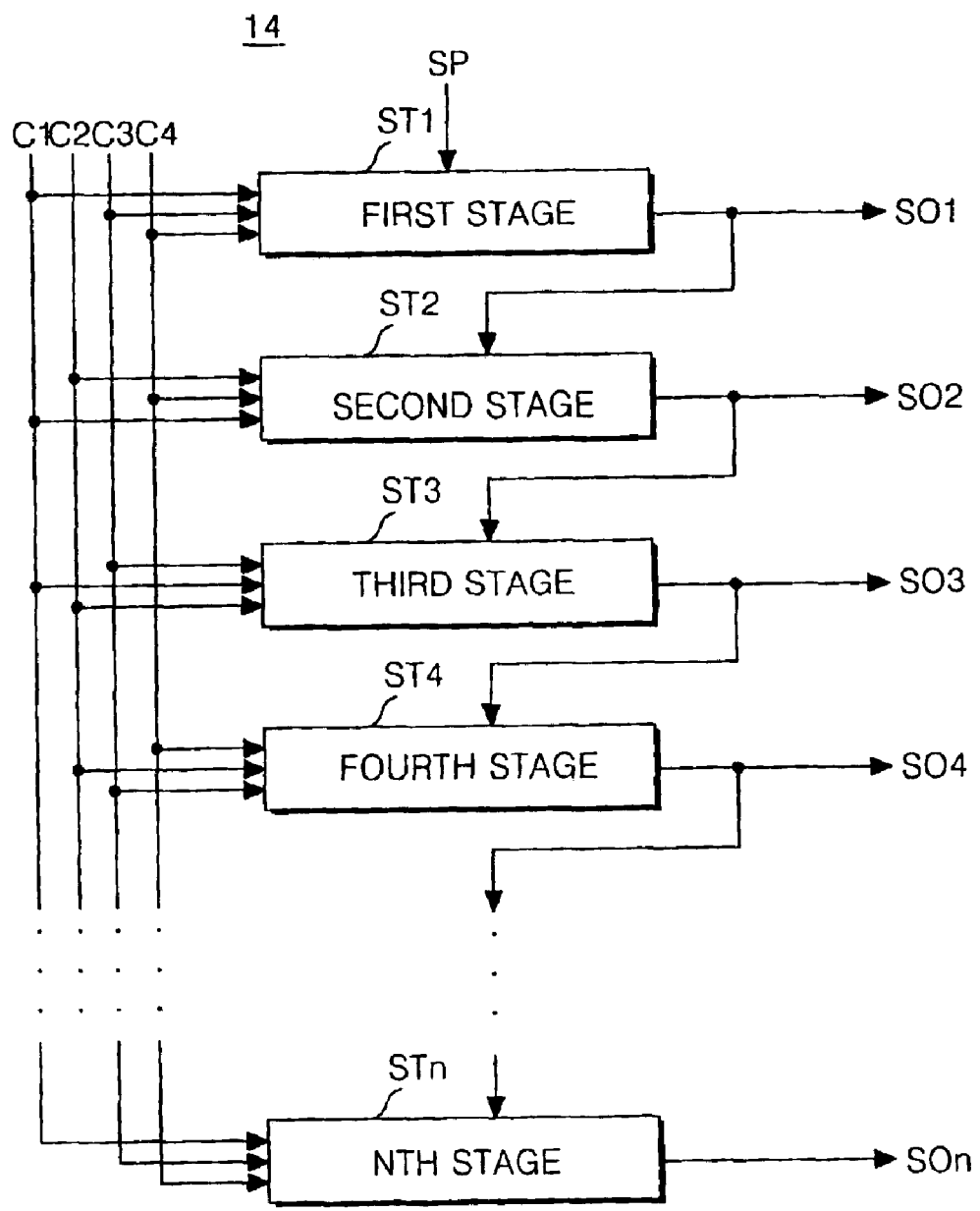
FIG. 2 illustrates a schematic view of the shift register shown in FIG. 1.
Figure 3:
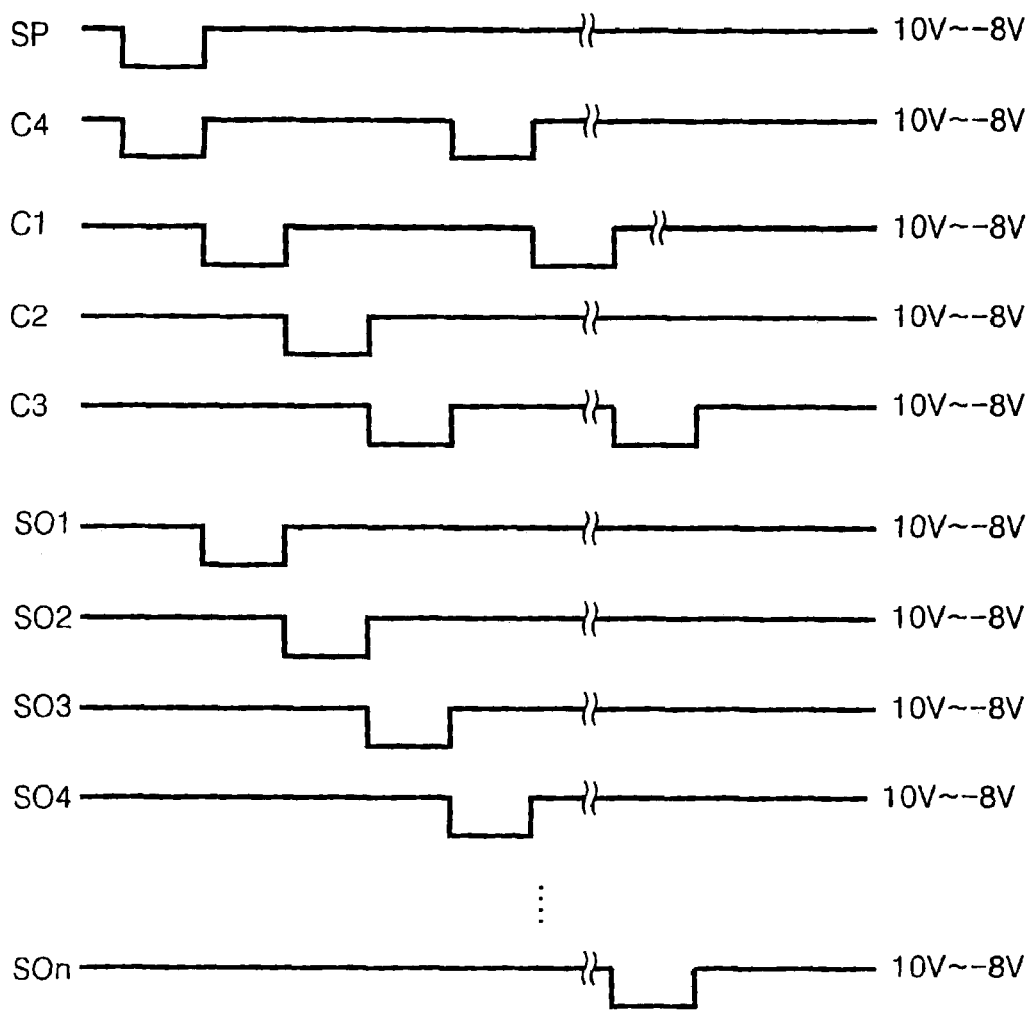
FIG. 3 illustrates input and output waveforms of the shift register shown in FIG. 2.
Figure 4:
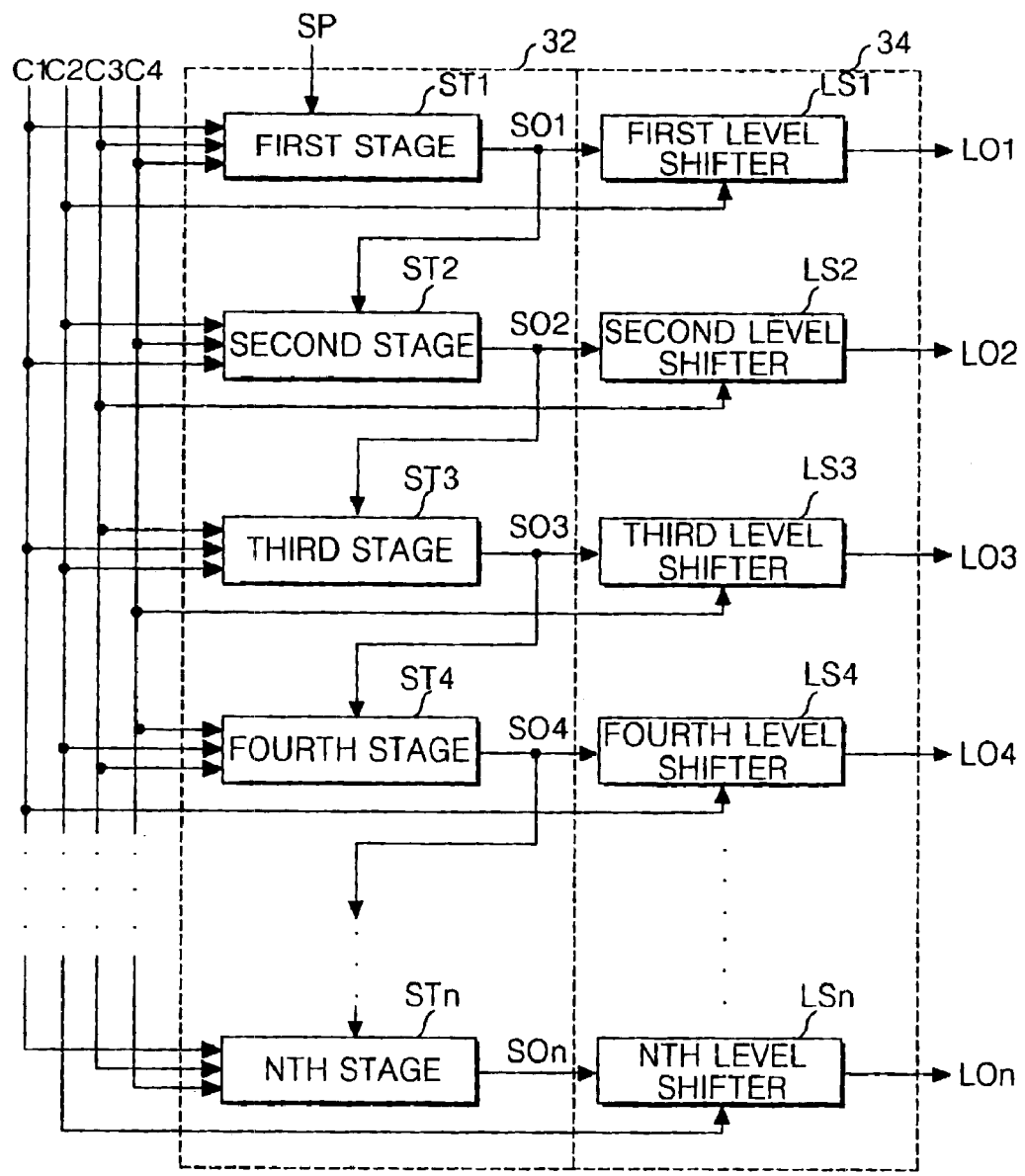
FIG. 4 illustrates a schematic block diagram showing a related art shift register incorporating a level shifter.

FIG. 4 illustrates a schematic block diagram showing a related art shift register incorporating a level shifter.

Referring to FIG. 4, the shift register incorporating a built-in level shifter includes a shift stage array 32 consisting of n shift stages ST1 to STn connected in cascade to an input line of a start pulse SP and connected to a level shifter array 34 consisting of level shifters LS1 to LSn. The level shifters LS1 to LSn are connected to respective ones of the output terminals of stages ST1 to STn.

Figure 5A:
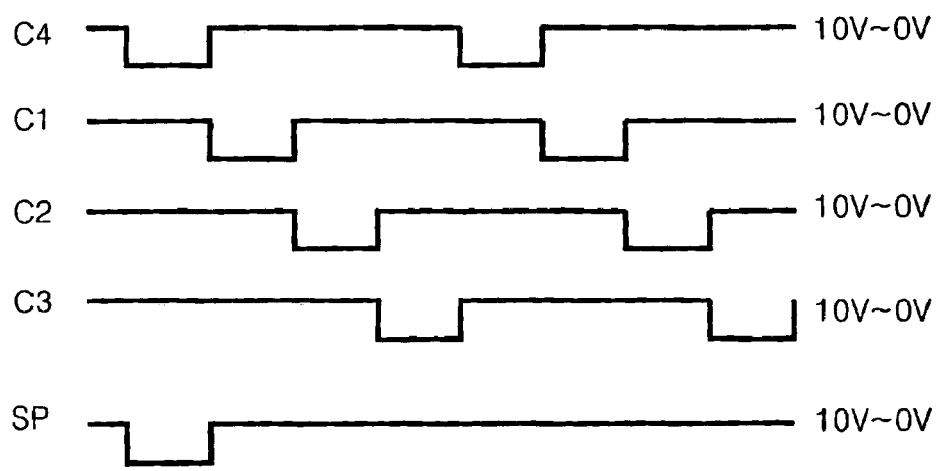
FIGS. 5A to 5C illustrate input and output waveforms of the shift register shown in FIG. 4.
Figure 5B:
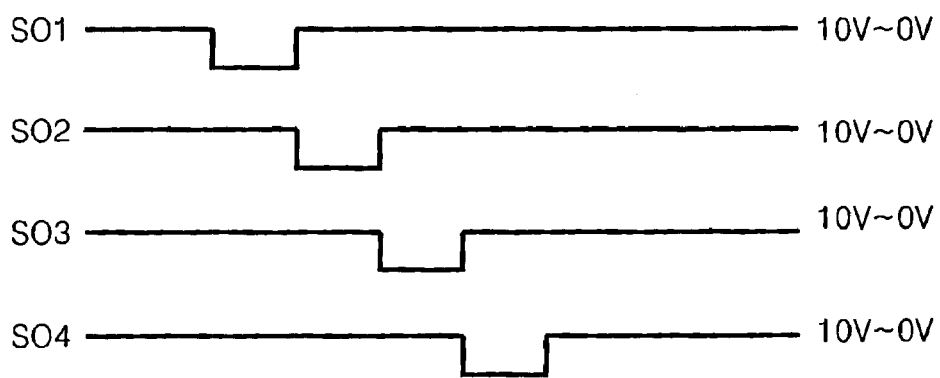

Within the shift stage array 32, the start pulse SP is outputted to the first stage ST1 and output signals of the first stage to the (n−1)th stage ST1 to ST(n−1), respectively, are outputted to the second to $n^{th}$ stages ST2 to STn, respectively. Each of the stages ST1 to STn receive three out of the first to fourth clock signals C1 to C4. Each of the received clock signals also has a swing voltage of 10V. The phase of each of the first to fourth clock signals C1 to C4 is sequentially delayed as shown in FIG. 5A. The stages ST1 to STn shift the start pulse SP using the three received clock signals and sequentially output shift signals SO1, SO2, . . . , to SOn as shown in FIG. 5B. Stages ST1 to STn output the shift signals SO1, SO2, . . . , to SOn using the input clock signals C1 to C4 and the start pulse SP, wherein the outputted shift signals have a swing voltage of 10V or less.

Figure 5C:
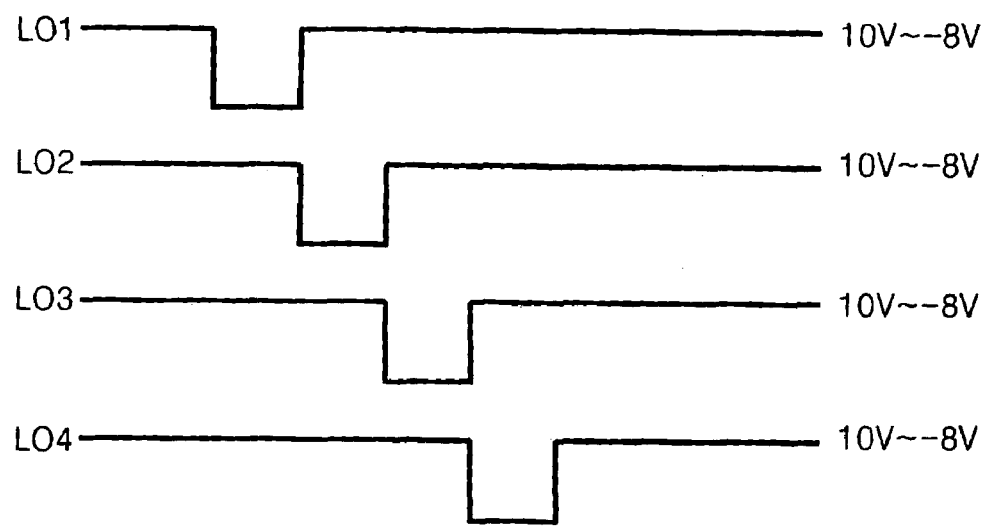

Each of the level shifters LS1 to LSn receives the remaining clock signal of the four clock signals C1 to C4 not received by the stages. Level shifters LS1 to LSn shift the level of the shift signals SO1, SO2, . . . , to SOn outputted from the stages ST1 to STn to output signals LO1, LO2, . . . , to LOn as shown in FIG. 5C. The output signals LO1, LO2, . . . , to LOn have a swing voltage of 10V or more. The level shifters LS1 to LSn level shift the minimal voltage of the shift signals SO1, SO2, . . . , to SOn outputted from the stages ST1 to STn down to a negative voltage. Subsequently, the level shifters LS1 to LSn output the level shifted voltages.

The outputted signals LO1, LO2, . . . , to LOn outputted from the shift register incorporating the built-in level shifter are used as scanning pulses applied from a gate driver to the gate lines. Accordingly, the gate driver may sequentially drive gate lines of a display panel. The outputted signals LO1, LO2, . . . , to LOn outputted from the shift register incorporating the built-in level shifter are also used as sampling signals applied to the sampling switches from the data driver. Accordingly, the data driver may sample video signals and supply the sampled video signals to the data lines of the display panel.

Figure 6:
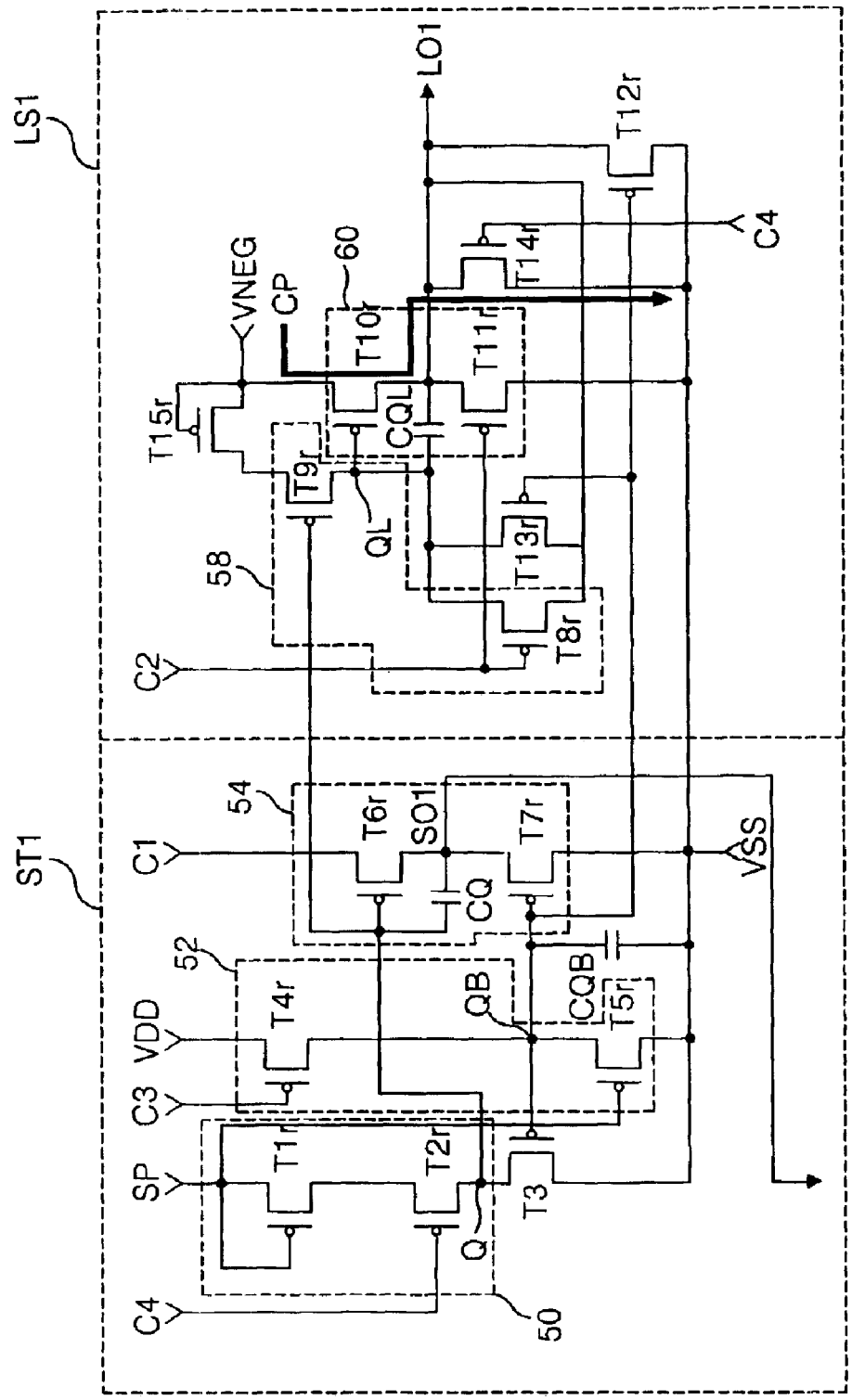
FIG. 6 illustrates a circuit diagram of a shift register incorporating the level shifter shown in FIG. 4.

FIG. 6 illustrates a circuit diagram of the shift register incorporating the built-in level shifter shown in FIG. 4.

Referring to FIG. 6, the first stage ST1 includes a first controller 50 for controlling a Q node in accordance with the start pulse SP and the fourth clock signal C4; a second controller 52 for controlling a QB node in accordance with the start pulse SP and the third clock signal C3; and a buffer 54 for selecting either the first clock signal C1 or the first supply voltage VSS and for outputting the selection in accordance with the voltage of the Q node and the QB node.

The first controller 50 controls a sixth PMOS transistor T6r included within the buffer 54 via the Q node to apply the first clock signal C1 as the output signal SO1 through the output line. Accordingly, the first controller 50 includes a first PMOS transistor T1r connected as a diode to the input line of the start pulse SP; a second PMOS transistor T2r connected to the first PMOS transistor T1r, an input line of the fourth clock signal C4, and the Q node. The first controller 50 further includes a third PMOS transistor T3r connected to the Q node, the QB node, and the input line of the first supply voltage VSS that, together with a seventh PMOS transistor T7r, controls the Q node.

The second controller 52 controls the seventh PMOS transistor T7r included within the buffer 54 via the QB node to apply the first supply voltage VSS as the output signal SO1 to the output line of the first stage ST1. Accordingly, the second controller 52 includes a fourth PMOS transistor T4r connected to an input line of the second supply voltage VDD, an input line of the third clock signal C3, and the QB node. The second controller 52 also includes a fifth PMOS transistor T5r connected to the fourth PMOS transistor T4r, the input line of the start pulse SP, and the input line of the first supply voltage VSS.

The buffer 54 includes the sixth transistor T6r for selecting the first clock signal C1 in accordance with a voltage of the Q node and for applying the first clock signal C1 to the output line. As mentioned above, the buffer 54 also includes the seventh PMOS transistor T7r, wherein the seventh PMOS transistor T7r selects the first supply voltage VSS in accordance with a voltage of the QB node and applies the selected first supply voltage VSS to the output line.

The first stage ST1 further includes a first capacitor CQ connected to a gate terminal and a source terminal of the sixth PMOS transistor T6r (between the Q node and the output line) in addition to a second capacitor CQB connected to a gate terminal and a source terminal of the seventh PMOS transistor T7r (between the QB node and the first supply voltage VSS).

The first level shifter LS1 includes a third controller 58 for controlling a QL node in accordance with a state of the second clock signal C2 and the Q node; an output part 60 for selecting either a negative voltage VNEG or the first supply voltage VSS and for outputting the selection in accordance with the voltage of the second clock signal C2 and the QL node.

The third controller 58 applies the negative voltage VNEG to the output line of the first level shifter LS1 through the Q node in accordance with the state of the second clock signal C2 and the Q node. Accordingly, the third controller 58 includes an eighth PMOS transistor T8r connected to the input line of the second clock signal C2, the output line LO1 of the first level shifter LS1, and the QL node. The third controller 58 also includes a ninth PMOS transistor T9r connected to the input line of the negative voltage VNEG, the Q node, and the QL node.

The output part 60 includes a tenth PMOS transistor T10r for selecting the negative supply voltage VNEG in accordance with the voltage of the QL node to and for supplying the selected negative supply voltage VNEG to the output line. The output part 60 also includes an eleventh PMOS transistor T11r for selecting the first supply voltage VSS and for outputting the first supply voltage VSS to the output line in accordance with the second clock signal C2.

The first level shifter LS1 further includes twelfth to fifteenth transistors T12r, T13r, T14r, and T15r for preventing distortion of the output signal LO1. The twelfth PMOS transistor T12r is connected to the output line of the first level shifter LS1, the QB node of the first stage ST1, and the first supply voltage VSS input line. The thirteenth PMOS transistor T13r is connected to the QL node, the QB node, and the output line of the first level shifter LS1. The fourteenth PMOS transistor T14r is connected to the output line of the first level shifter LS1, the gate terminal of the second PMOS transistor T2r, and the input line of the first supply voltage VSS. The fifteenth PMOS transistor T15r is connected as a diode to the input line of the negative voltage VNEG and the source terminal of the ninth PMOS transistor T9r.

The first level shifter LS1 further includes a third capacitor CQL connected to the gate terminal and the source terminal of the tenth PMOS transistor T10r (between the QL node and the output line).

Figure 7:
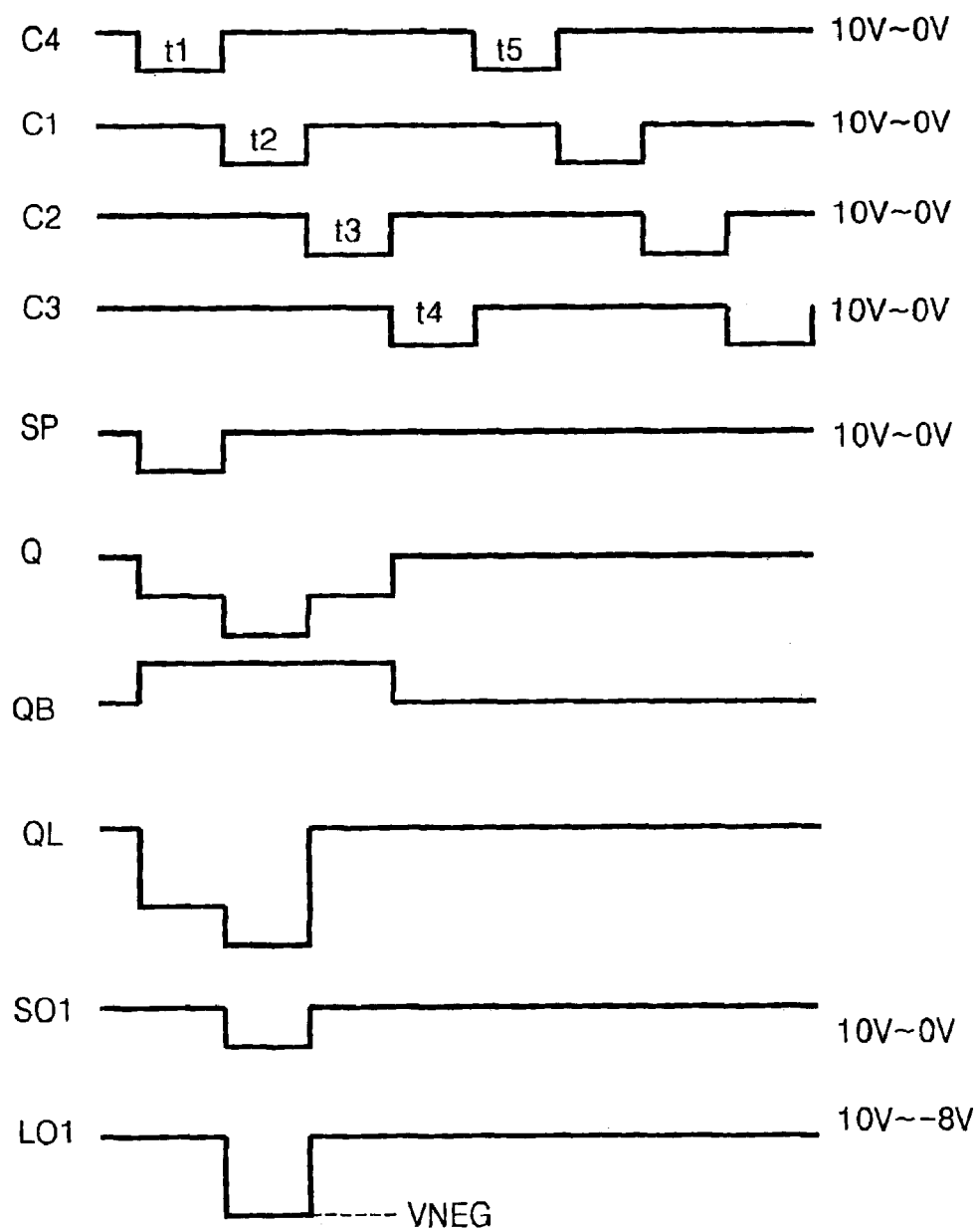
FIG. 7 illustrates input and output waveforms of the shift register shown in FIG. 6.

The first stage ST1 and the level shifter LS1 illustrated in FIG. 6 are supplied with the first to fourth clock signals C1 to C4 having phases that are sequentially delayed by one clock signal, as shown in FIG. 7, wherein the phase of the fourth clock signal C4 is synchronized with the start pulse SP. The first to fourth clock signals C1 to C4, including the start pulse SP, are applied as negative polarity pulses having swing voltages of 10V or less. For purposes of illustration, it is assumed that a 10V level represents a low state while a 0V level represents a high state.

Referring to FIGS. 6 and 7, operations of the first stage ST1 and the level shifter LS1 will be described in greater detail below.

During a first period of time, t1, the voltages of start pulse SP and the fourth clock signal C4 are synchronized to represent a high state such that the first and second PMOS transistors T1r and T2r are turned on and a voltage of about 2V is charged at the Q node. Accordingly, the sixth and ninth PMOS transistors T6r and T9r, having the gate terminals connected to the Q node, are slowly turned on. Also during the first period of time, t1, the fifth PMOS transistor T5r is turned on by the high state voltage of the start pulse SP and charges a low state voltage of 10V, supplied from the first supply voltage VSS input line, to the QB node. Accordingly, the third and seventh PMOS transistors T3r and T7r, having the gate terminals connected to the QB node, are turned off. As a result, a low state voltage of 10V is applied from the first clock signal C1 to the output line of the first stage ST1 via the turned-on sixth PMOS transistor T6r. Accordingly, the first stage ST1 outputs an output signal SO1 representing a low state.

The negative voltage VNEG is pre-charged to the QL node through the fifteenth PMOS transistor T15r and the ninth PMOS transistor T9r. Accordingly, the tenth PMOS transistor T10r is incompletely turned on, the fifteenth PMOS transistor T15r is turned on as a diode by a negative voltage of −8V, and the ninth PMOS transistor T9r is turned on by the Q node.

Still during the first period of time, t1, the fourteenth PMOS transistor T14r is turned on by the high state of the fourth clock signal C4 such that the first supply voltage Vss is applied to the output line of the first level shifter LS1 even though the tenth PMOS transistor T10r is incompletely turned on. Accordingly, the first level shifter LS1 outputs the output signal LO1 representing a low state.

During a second period of time, t2, the voltages of the start pulse SP and the fourth clock signal C4 remain synchronized but represent a low state while a voltage of the first clock signal C1 represents a high state. Accordingly, the first and second PMOS transistors T1r and T2r are turned off and the sixth transistor T6r is turned on. Further, an internal parasitic capacitor Cgs (not shown), defined between a gate and a source of the sixth PMOS transistor T6r, and the first capacitor CQ induces a bootstrapping phenomenon at the Q node, wherein the Q node is placed in a floating state by the high state voltage of the first clock signal C1. As a result, the sixth transistor T6r is completely turned on so the high state voltage of the first clock signal C1 (i.e., 0V) is rapidly charged to the output line of the stage ST1. Accordingly, the output line of the first stage ST1 outputs an output signal SO1 representing a high state.

Still during the second period of time, t2, the tenth PMOS transistor T10r is completely turned on because the negative voltage VNEG is charged to the QL node via the fifteenth PMOS transistor T15r and the ninth PMOS transistor T9r. The fifteenth PMOS transistor T15r is turned on by the negative voltage while the ninth PMOS transistor T9r is completely turned on in accordance with the bootstrapped Q node.

An internal parasitic capacitor Cgs (not shown), defined inside the tenth PMOS transistor T10r, and the third capacitor CQL induces a bootstrapping phenomenon at the QL node and the Q node. Thus it is possible to completely turn on the tenth transistor T10r. A negative voltage VNEG is charged to the output line of the first level shifter LS1 through the completely turned on tenth PMOS transistor T10r such that the first level shifter LS1 outputs an output signal LO1 representing a high state.

During a third period of time, t3, a voltage of first clock signal C1 represents a low state while a voltage of the second clock signal C2 represents a high state. Accordingly, a voltage at the Q node drops down to about 2V such that the Q node represents a low level high state while the sixth transistor T6r remains turned-on. Thus, a low state voltage of 10V is charged by the first clock signal C1 to the output line of the first stage. Accordingly, the first stage ST1 outputs the output signal SO1 representing a low state. Further, the eighth transistor T8r is turned on by the second clock signal C2 representing a high state, the voltage at the QL node is discharged, and the tenth PMOS transistor T10r is turned off. Still during the third period of time, t3, the eleventh PMOS transistor T11r is turned on by the second clock signal C2 representing a high state and the first supply voltage VSS is charged to the output line of the first level shifter LS1. As a result, the first level shifter LS1 outputs an output signal LO1 representing a low state.

During a fourth period of time, t4, a voltage of the third clock signal C3 represents a high state. Accordingly, the fourth PMOS transistor T4r is turned on to charge a high state voltage of 0V from the second supply voltage VDD to the QB node. As a result, the third, seventh, twelfth, and thirteenth PMOS transistors T3r, T7r, T12r, and T13r, respectively, are simultaneously turned on.

During the fourth period of time, t4, the 2V at the Q node, charged via the turned-on the third PMOS transistor T3r, is discharged to the low state such that the sixth PMOS transistor T6r is turned off and the first supply voltage VSS is charged to the output line of the first stage ST1 via the turned-on seventh PMOS transistor T7r. Accordingly, the first stage ST1 outputs the output signal SO1 representing a low state. Further, the second capacitor CQB prevents the voltage present at the QB node from being distorted by a leakage current from the third and seventh PMOS transistors T3r and T7r, respectively.

Still during the fourth period of time, t4, the first supply voltage VSS is applied to the output line of the first level shifter LS1 via the turned-on twelfth PMOS transistor T12r such that the first level shifter LS1 outputs the output signal LO1 representing a low state. Further, the thirteenth PMOS transistor T13r, turned on by the high state at the QB node, prevents the QL node from being placed in a floating state by the turned-off ninth PMOS transistor T9r. Accordingly, the thirteenth PMOS transistor T13r prevents the low state output signal LO1 on the output line of the first level shifter LS1 from being distorted by the leakage current at the turned-off tenth PMOS transistor T10r.

During a fifth period of time, t5, a voltage of the fourth clock signal represents a high state, the second and fourteenth PMOS transistors T2r and T14r are turned on, the first and fifth PMOS transistors T1r and T5r remain in a turned-on state, and the QB node remains at its previous high state. Accordingly, PMOS transistors T3r, T7r, T12r, and T13r maintain their turned-on states so that the output line of the first stage ST1 and the output line of the first level shifter LS1 remain at a low state.

The aforementioned shift register incorporating the built-in level shifter outputs a shifted signal having a swing voltage of 10V or more using the clock signals and start pulse having a swing voltage of 10V or less. Accordingly, the aforementioned shift register incorporating the built-in level shifter is capable of level-shifting the minimum voltage down in a negative direction using only PMOS transistors.

In the aforementioned shift register incorporating the built-in level shifter, the tenth and fourteenth PMOS transistors T10r and T14r are simultaneously turned on by the start pulse SP and the voltage of the fourth clock signal C4 representing the high state during the first period of time, t1. Accordingly, a static current, identified as current path CP, is formed via the turned-on tenth and fourteenth transistor T10r and T14r. The static current causes power to be dissipated.

Figure 8A:
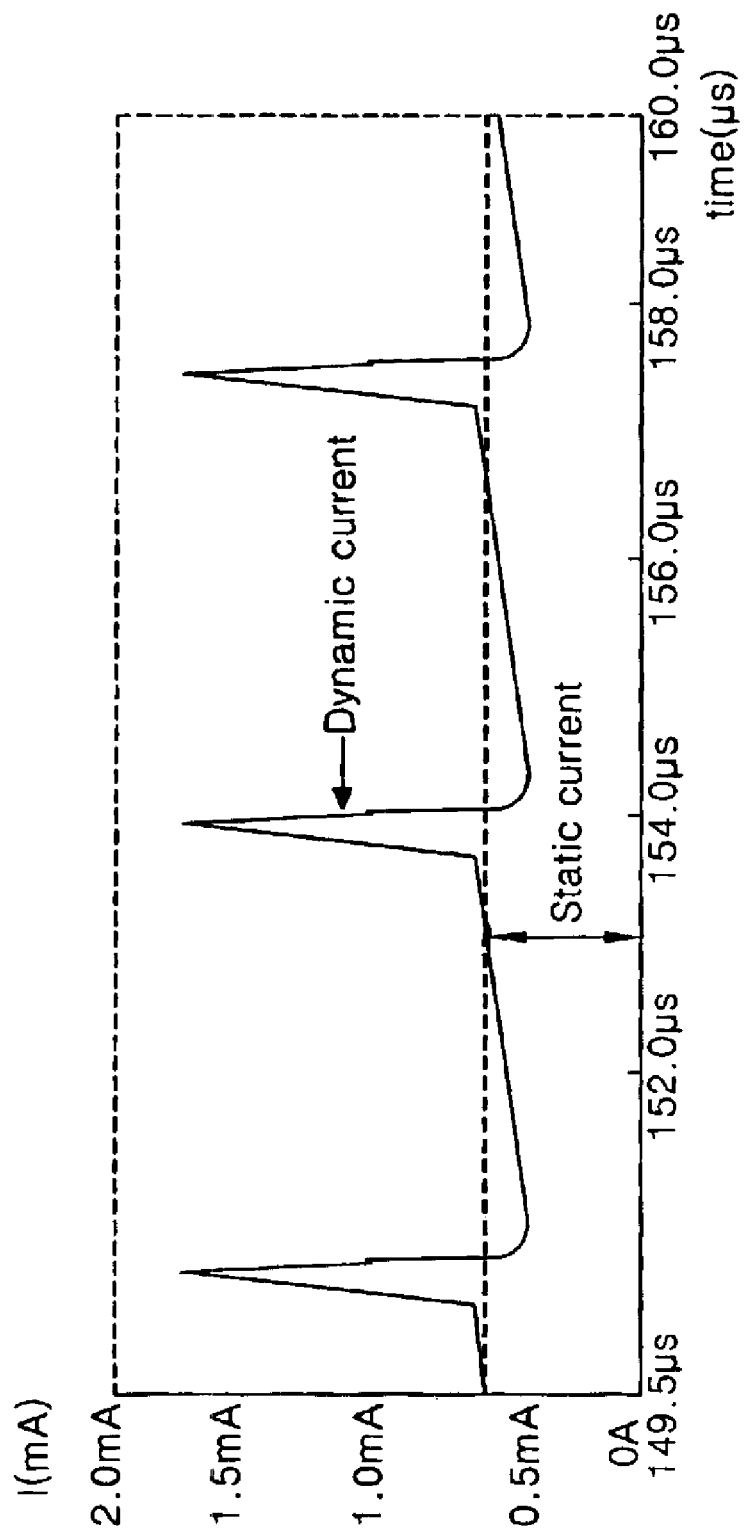
FIGS. 8A to 8C are the waveforms representing a static current by the fourteenth PMOS transistor shown in FIG. 6 and the distortion of a signal waveform and its power dissipation according to the channel width thereof.
Figure 8B:
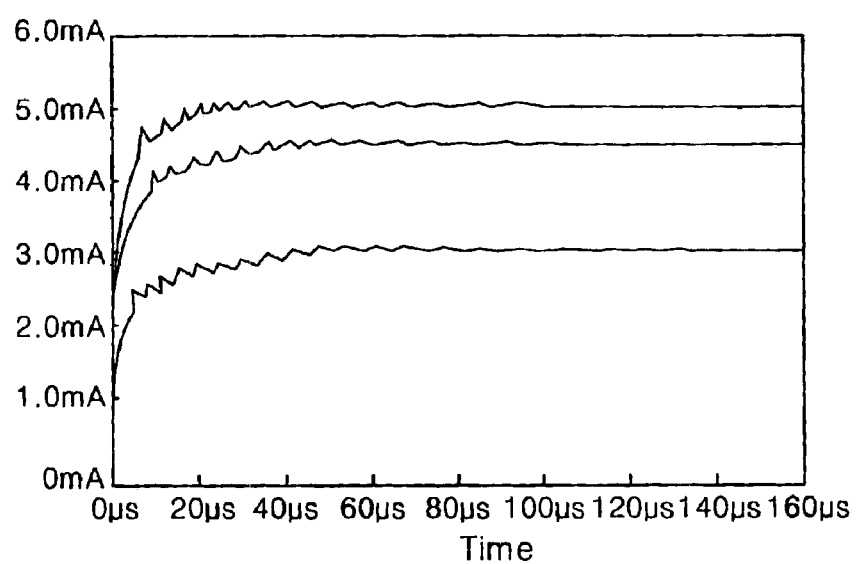
Figure 8C:
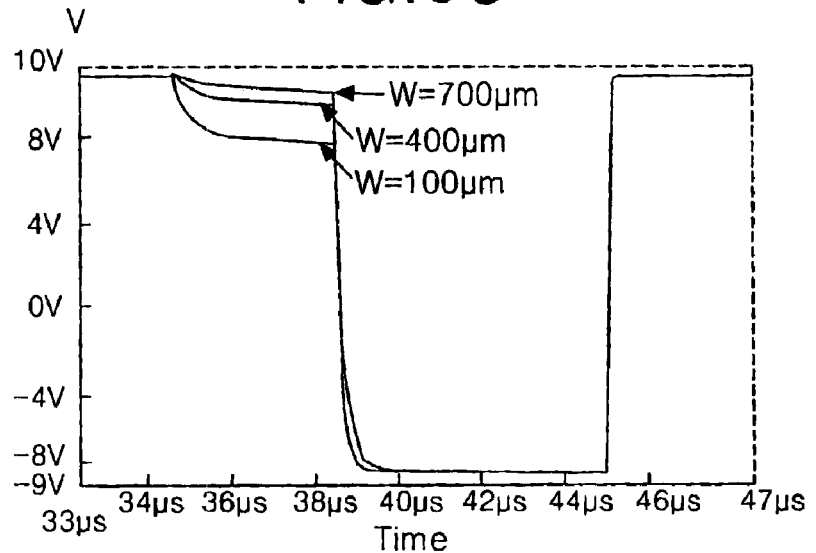

The tenth, eleventh, and fourteenth PMOS transistors T10r, T11r, and T14r, respectively, heavily influence the falling time, rising time, waveform distortion, and power dissipation characteristics of the output signal LO1 of the first level shifter LS1 shown in FIG. 6. As shown in FIGS. 8A–8C, the fourteenth PMOS transistor T14r, in particular, influences the power dissipation and the waveform distortion characteristics of the output signal.

Referring to FIG. 8A, a relatively large amount of static current is uniformly consumed by the turned-on tenth and fourteenth PMOS transistor T10 and T14 due to the presence of current path CP. As a result of the uniform consumption of static current, power dissipation increases. The dynamic current shown in FIG. 8A represents the current generated whenever the shift register shown in FIG. 6 supplies a high state output signal LO1.

Static current consumption increases in accordance with the channel width of the tenth and fourteenth PMOS transistors T10r and T14r, which form the current path CP. The channel widths of the tenth and fourteenth PMOS transistors T10r and T14r influence the static current consumption, because the power dissipation increases as the channel width of the fourteenth PMOS transistor T14r increases. Referring to FIG. 8B, for example, it can been seen that power dissipation increases as the channel width, W, of the transistor increases from about 100⊠ m to about 400⊠ m and to about 700⊠ m. Consequently, the channel width of the fourteenth PMOS transistor T14r should be maintained to be narrow in order to reduce the power dissipation caused by the static current. However, when the channel width of the fourteenth PMOS transistor T14r is narrow, the output signal of the shift register cannot be efficiently prevented from being distorted. Distortion of the output signal cannot be efficiently prevented because the output signal of the shift register becomes distorted as the channel width, W, of the fourteenth PMOS transistor T14r decreases from about 700⊠ m to about 400⊠ m and to about 100⊠ m, as shown in FIG. 8C. Thus, in order to prevent the output signal of the shift register from being distorted, the channel of the fourteenth transistor T14r must be made wide.

As mentioned above, the tenth PMOS transistor T10r heavily influences the falling time of the output waveform. Accordingly, as the channel width of the tenth PMOS transistor T10r is reduced, the falling time of the output signal is lengthened and the output signal becomes distorted. Therefore, the channel width of the tenth PMOS transistor T10r cannot be made narrow.

As a result, the channels of the tenth and fourteenth PMOS transistors T10r and T14r shown in FIG. 6 must be made wide in order to prevent the distortion of the output signal waveform. Deleteriously, however, the amount of static current increases along with an increase in power dissipation.

Accordingly, the present invention reduces the static current in a shift register incorporating the built-in level shifter shown in FIG. 6 while reducing power dissipation. A detailed description of the shift register incorporating a built-in level shifter, in accordance with the principles of the present invention and capable of reducing static current consumption, will now be discussed in greater detail with reference to FIG. 9 to 13.

Figure 9:
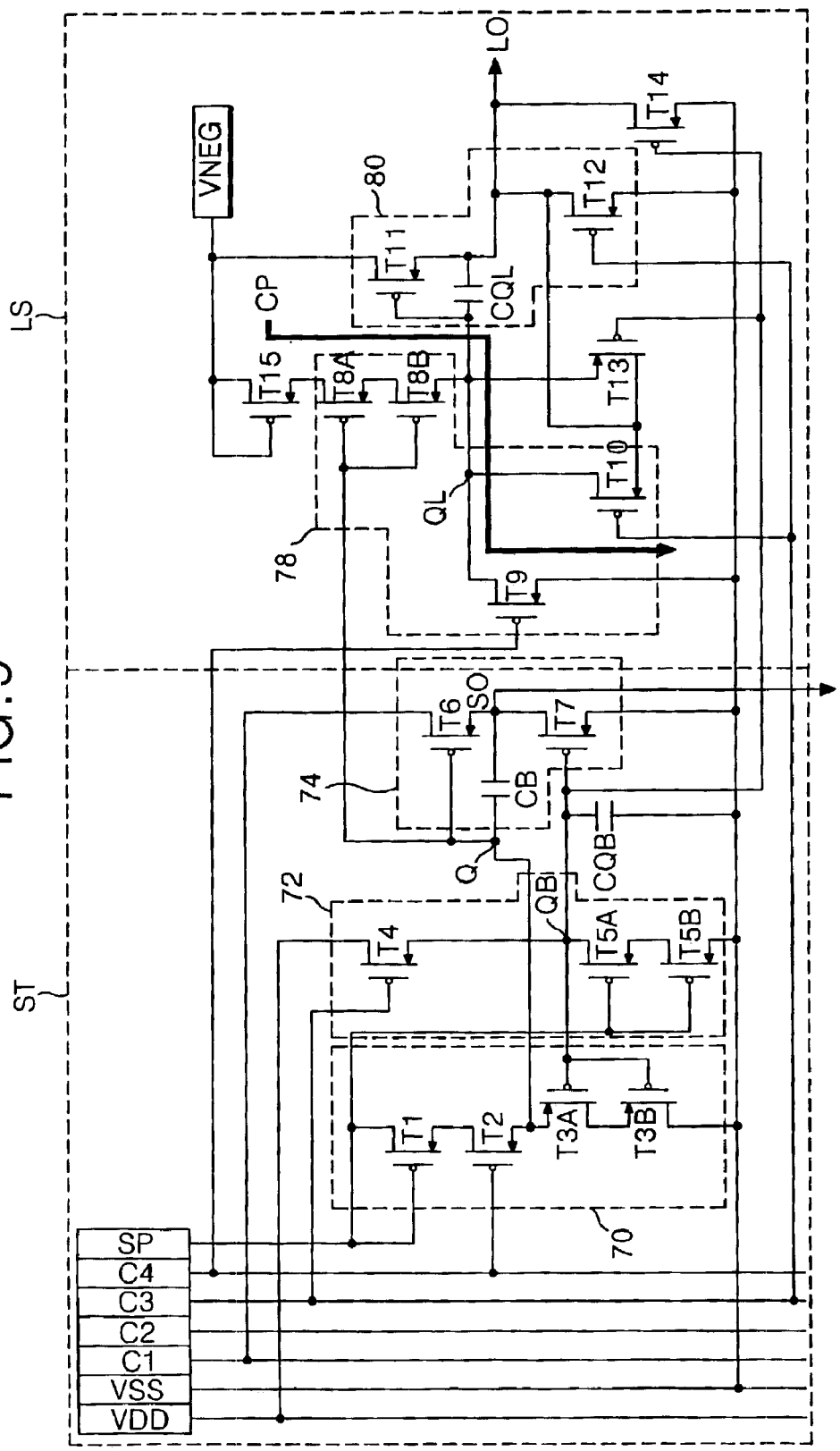
FIG. 9 illustrates a circuit diagram of a shift register incorporating a level shifter in accordance with one aspect of the present invention.

FIG. 9 illustrates a circuit diagram of a shift register incorporating a built-in level shifter in accordance with one aspect of the present invention.

Referring to FIG. 9, a stage ST may, for example, include a first controller 70 for controlling a Q node in accordance with the voltage of a QB node, a start pulse SP, and a fourth clock signal C4; a second controller 72 for controlling the QB node in accordance with a third clock signal C3 and the start pulse SP; and a buffer 74 for selecting either a first clock signal C1 or a first supply voltage VSS and for outputting the selection in accordance with the voltage of the Q node and the QB node.

In one aspect of the present invention, the first controller 70 may control a sixth PMOS transistor T6 within the buffer 74 via the Q node to apply the first clock signal C1 as the output signal SO through the output line. Accordingly, the first controller 70 may, for example, include a first PMOS transistor T1 connected as a diode to the input line of the start pulse SP; a second PMOS transistor T2 connected to the first PMOS transistor T1, an input line of the fourth clock signal C4, and the Q node; and PMOS transistors T3A and T3B connected to the Q node, the QB node, and the input line of the first supply voltage VSS. In one aspect of the present invention, the PMOS transistors T3A and T3B may have dual gate configuration and prevent a leakage current from being generated.

In one aspect of the present invention, the second controller 72 may control the seventh PMOS transistor T7 of the buffer 74 through the QB node to apply the first supply voltage VSS as the output signal SO through the output line. Accordingly, the second controller 72 may, for example, include a fourth PMOS transistor T4 connected to an input line of a second supply voltage VDD, an input line of the third clock signal C3, and the QB node. The second controller 72 may also include PMOS transistors T5A and T5B connected to the fourth PMOS transistor T4, the input line of the start pulse SP, and the input line of the first supply voltage VSS. In one aspect of the present invention, the PMOS transistors T5A and T5B may have dual gate configuration and prevent a leakage current from being generated.

In one aspect of the present invention, the buffer 74 may, for example, include the sixth transistor T6 for selecting the first clock signal C1 in accordance with the voltage of the Q node and for applying the selected first clock signal C1 to the output line. The buffer 74 may also include the seventh PMOS transistor T7 for selecting the first supply voltage VSS in accordance with the voltage of the QB node and for applying the selected first supply voltage VSS to the output line.

The stage ST may, for example, further include a first capacitor CB connected between a gate terminal and a source terminal of the sixth PMOS transistor T6 (between the Q node and the output line) and a second capacitor CQB connected between a gate terminal and a source terminal of the seventh PMOS transistor T7 (between the QB node and the first supply voltage VSS).

A level shifter LS may, for example, include a third controller 78 controlling a QL node in accordance with the voltage of the Q node and also in accordance with the third and fourth clock signals C3 and C4; an output part 80 selecting either a negative voltage VNEG or the first supply voltage VSS and for outputting the selection in accordance with the voltage of the QL node and the third clock signal C3.

In one aspect of the present invention, the third controller 78 may enable the output part 80 to output either the negative voltage VNEG or the first supply voltage VSS. In one aspect of the present invention, the negative voltage VNEG or the first supply voltage VSS may be outputted by charging/discharging the Q node in accordance with the voltage of the Q node and the third and fourth clock signals C3 and C4, respectively. Accordingly, the third controller 78 may, for example, include PMOS transistors T8A and T8B connected to the input line of the negative voltage VENG, the Q node, and the QL node; a ninth PMOS transistor T9 connected between the QL node, the input line of the fourth clock signal C4, and the input line of the first supply voltage VSS; a tenth PMOS transistor T20 connected to the QL node, the input line of the third clock signal C3, and the output line of the level shifter LS. In one aspect of the present invention, the PMOS transistors T8A and T8B may have dual gate configuration and prevent a leakage current from being generated.

In one aspect of the present invention, the output part 80 may, for example, include an eleventh PMOS transistor T11 for selecting the negative supply voltage VNEG in accordance with the voltage of the QL node and for supplying the negative supply voltage VNEG to the output line. The output part 80 may also, for example, include a twelfth PMOS transistor T12 for selecting the first supply voltage VSS and for outputting the first supply voltage VSS to the output line in accordance with the third clock signal C3.

The level shifter LS may further include thirteenth to fifteenth transistors T13, T14, and T15 for preventing distortion of the output signal LO. The thirteenth PMOS transistor T13 may be connected to the QL node, the QB node of the stage ST, and the output line of the level shifter LS. The fourteenth PMOS T14 may be connected to the output line of the level shifter LS, the QB node, and the input line of the first supply voltage VSS. The fifteenth PMOS T15 may be connected as a diode to the input line of the negative voltage VNEG and a source terminal of the transistor PMOS T8A.

The level shifter LS may further include a third capacitor CQL connected to a gate terminal and a source terminal of the eleventh PMOS transistor T11 (between the QL node and the output line).

In one aspect of the present invention, the stage ST and the level shifter LS illustrated in FIG. 9 may be supplied with the first to fourth clock signals C1 to C4 having phases that are sequentially delayed by one clock signal, as shown in FIG. 10. For example, the phase of the fourth clock signal C4 may be substantially synchronized with the phase of the start pulse SP. Referring back to FIG. 9, the first to fourth clock signals C1 to C4, including the start pulse SP, may be applied as negative polarity pulses having swing voltages of 10V or less. For purposes of illustration, it is assumed that a 10V level represents a low state while a 0V level represents a high state.

Referring to FIGS. 9 and 10, operations of the stage ST and the level shifter LS will be described in greater detail below.

During a first period of time, t1, the start pulse SP and the fourth clock signal C4 may be synchronized in a high state such that the first and second PMOS transistors T1 and T2 are turned on and a voltage of about 2V is charged at the Q node. Accordingly, the sixth transistor T6 and the PMOS transistors T8A and T8B, having the gate terminals connected to the Q node, are slowly turned on. Also during the first period of time, t1, the PMOS transistors T5A and T5B may be turned on by the high state voltage of the start pulse SP and charge a low state voltage of 10V, supplied from the first supply voltage VSS input line, to the QB node. Accordingly, the transistors T3A and T3B and the seventh PMOS transistor T7, having the gate terminals connected to the QB node, may be turned off. As a result, a low state voltage of 10V may be applied from the first clock signal C1 and charged to the output line of the stage ST via the turned-on sixth PMOS transistor T6. Accordingly, the stage ST outputs an output signal SO representing a low state.

In one aspect of the present invention, the negative voltage VNEG may be pre-charged to the QL node through the turned-on transistors T8A and T8B. Accordingly, the fifteenth PMOS transistor T15 may be turned on as a diode by a negative voltage of −8V and the PMOS transistors T8A and T8B may be turned on by the Q node. Because the ninth PMOS transistor T9, turned on by a voltage of the fourth clock signal C4 representing a high state, may cause the QL node to be discharged to a low state, the eleventh PMOS transistor T11 may be turned off such that the state (e.g., voltage) of the output signal LO of the level shifter LS is maintained.

During a second period of time, t2, the voltages of the start pulse SP and the fourth clock signal C4 are synchronized and represent a low state while a voltage of the first clock signal C1 represents a high state. Accordingly, the first and second PMOS transistors, T1 and T2, respectively, are turned off and the sixth transistor T6 is turned on. Further, an internal parasitic capacitor Cgs (not shown), defined between a gate and a source of the sixth PMOS transistor T6, and the first capacitor CQ induces a bootstrapping phenomenon at the Q node, wherein the Q node is placed in a floating state by the high state voltage of the first clock signal C1. As a result, the sixth transistor T6 is completely turned on so the high state voltage of the first clock signal C1 is rapidly charged to the output line of the stage ST. Accordingly, the stage ST outputs an output signal SO representing a high state.

Still during the second period of time, t2, the eleventh PMOS transistor T11 is completely turned on because the negative voltage VNEG is charged to the QL node via the fifteenth PMOS transistor T15 and the PMOS transistors T8A and T8B. For example, the fifteenth PMOS transistor T15 may be turned on by the negative voltage VNEG while the PMOS transistors T8A and T8B may be completely turned on in accordance with the bootstrapped Q node.

In one aspect of the present invention, an internal parasitic capacitor Cgs (not shown), defined between a gate and source of the eleventh PMOS transistor T11, and the third capacitor CQL may induce a bootstrapping phenomenon at the QL node in addition to the Q node. Thus it is possible to completely turn on the eleventh transistor T11. A negative voltage VNEG may be charged to the output line of the level shifter LS through the completely turned-on eleventh PMOS transistor T11 such that the level shifter LS outputs an output signal LO representing a high state. In one aspect of the present invention, the fifteenth PMOS transistor T15, connected as diode, has a narrow channel width to prevent the leakage current at the PMOS transistors T8A and T8B. In another aspect of the present invention, the threshold voltage of the PMOS transistors T8A and T8B is low and leakage current of the PMOS transistors T8A and T8B causes the voltage in the QL node to be discharged to a low state. Accordingly, it is possible to prevent the output signal LO of the level shifter LS from being distorted. In one aspect of the present invention, the fifteenth PMOS transistor T15 may be omitted as the PMOS transistors T8A and T8B have a dual gate configuration to reduce an amount of leakage current generated.

During a third period of time, t3, a voltage of the first clock signal C1 represents a low state while a voltage of the second clock signal C2 represents a high state. Accordingly, a voltage at the Q node drops down to about 2V such that a voltage at the Q node represents a low level high state while the sixth transistor T6 remains turned-on. Thus, a low state voltage of 10V is charged by the first clock signal C1 to the output line of the stage ST. Accordingly, the stage ST may output an output signal SO representing a low state. In one aspect of the present invention, the negative voltage VNEG may be charged to the QL node via the fifteenth PMOS transistor T15, turned on by a negative voltage VNEG of about −8V, and the PMOS transistors T8A and T8B, turned on by the Q node. Thus, the eleventh PMOS transistor T11 may remain in a turned-on state and the negative voltage VNEG may be charged to the output line of the level shifter LS via the turned-on eleventh PMOS transistor T11. As a result, the level shifter LS may output an output signal LO representing high state.

During a fourth period of time, t4, a voltage of the third clock signal C3 represents a high state. Accordingly, the fourth PMOS transistor T4 may be turned to charge a high state voltage of 0V from the second supply voltage VDD to the QB node. As a result, PMOS transistors T3A, T3B, T7, T10, and T13 are simultaneously turned-on. In one aspect of the present invention, the voltage charged at the Q node via the turned-on PMOS transistors T3A and T3B, representing the low level high state, may be discharged to a low state and the sixth PMOS transistor T6 may be turned off. Further, the first supply voltage VSS may be charged to the output line of the stage ST via the turned-on seventh PMOS transistor T7 and the stage ST may output an output signal SO representing a low state.

In one aspect of the present invention, the second capacitor CQB may prevent voltage at the QB node from being distorted by a leakage current from the PMOS transistors T3A, T3B, and T7. In another aspect of the present invention, the voltage at QL node may be discharged to a low state via the turned-on tenth transistor T10, the eleventh transistor T11 may be turned off, and the output line of the level shifter LS may be supplied with the first supply voltage VSS via the turned-on twelfth transistor T12. Accordingly, the level shifter LS may output an output signal LO representing a low state.

Still during the fourth period of time, t4, the thirteenth and fourteenth PMOS transistors T13 and T14 may be turned on by voltage at the QB node representing a high state and prevent the low state output signal LO on the output line of the level shifter LS from being distorted by the leakage current of the turned-off eleventh PMOS transistor T11.

During a fifth period of time, t5, a voltage of the fourth clock signal C4 represents a high state, the second and ninth PMOS transistors T2 and T9 are turned on, the PMOS transistors T1, T5A, and T5B remain in a turned-off state, and the voltage at the QB node remains at the previous high state. Accordingly, the PMOS transistors T3A, T3B, and T7 maintain their turned-on states, as in the fourth period of time, t4, and a voltage of the output signal SO of the stage ST remains at the low state. In one aspect of the present invention, a voltage of the output signal LO of the level shifter LS remains at a low state since the fourteenth PMOS transistor T14 is turned-on by the voltage at the QB node representing the high state to apply the first supply voltage VSS representing a low state. In another aspect of the present invention, the eleventh PMOS transistor T11 may be maintained in a turned-off state via the turned-on ninth and thirteenth PMOS transistor T9 and T13. Accordingly, an output signal LO of the level shifter LS may be prevented from being distorted by the leakage current from the eleventh PMOS transistor T11.

According to the principles of the present invention, the shift register incorporating the built-in level shifter illustrated in FIG. 9 level-shifts the minimum voltage in a negative direction using only PMOS transistors. Accordingly, a shift signal having a swing voltage of 10V or more may be outputted using clock signals and start pulse having swing voltages of 10V or less.

According to the principles of the present invention, the eleventh, twelfth, and ninth PMOS transistors T11, T12, and T9 influence the falling time, rising time, waveform distortion, and power dissipation characteristics of output signals LO outputted by the shift register LS. In one aspect of the present invention, the ninth and fifteenth PMOS transistors T9 and T15 may be turned on during the first period of time, t1, by voltages of the start pulse SP and the fourth clock signal C4 representing a high state simultaneously with the PMOS transistors T8A and T8B. As a result, a current path CP may be formed to control power dissipation characteristics of the shift register illustrated in FIG. 9. While a predetermined amount of static current dissipates within the current path CP traveling through the turned-on PMOS transistors T15, T8A, T8B, and T9, the static current consumption may be reduced by approximately 1/10 compared with the static current consumption of shift registers such as those illustrated in FIG. 6 because the channel widths of the transistors T15, T8A, T8B, and T9, forming the current path CP, are narrow.

The static current consumption may be reduced because the transistors T15, T8A, T8B, and T9, while forming the current path CP, all indirectly control the output signal LO of the level shifter LS through the QL node. For example, the tenth and eleventh PMOS transistors T10r and T11r in level shifters such as those shown in FIG. 6 form the current path and directly charges/discharges the output signal LO1 of the first level shifter LS1. Accordingly, the channel widths of the tenth and eleventh PMOS transistors have a strong influence on the waveform distortion of the output signal LO1. The PMOS transistors T15, T8A, T8B, and T9, shown in FIG. 9, however, control the QL node. Accordingly, the channel widths of the PMOS transistors T15, T8A, T8B, and T9 have a relatively weak influence on the waveform distortion of the output signal LO. As a result, the PMOS transistors T15, T8A, T8B, and T9, while forming the current path CP illustrated in FIG. 9, may be made to have relatively narrow channel widths so that the static current consumed by the current path is be reduced by about 1/10 as compared with shift registers such as those illustrated in FIG. 6.

Figure 11B:
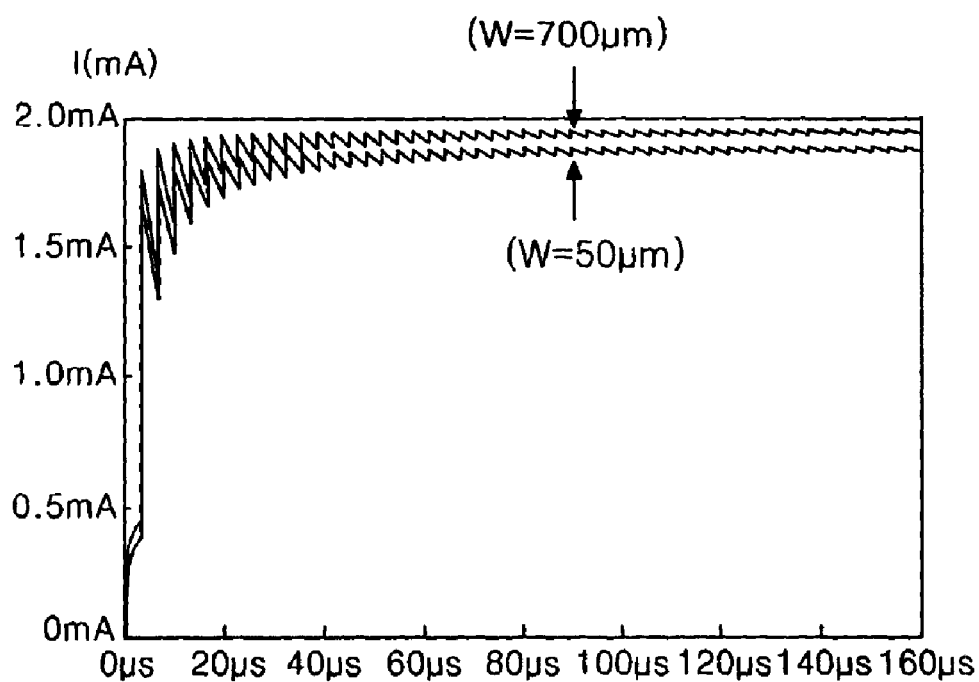
Figure 11C:
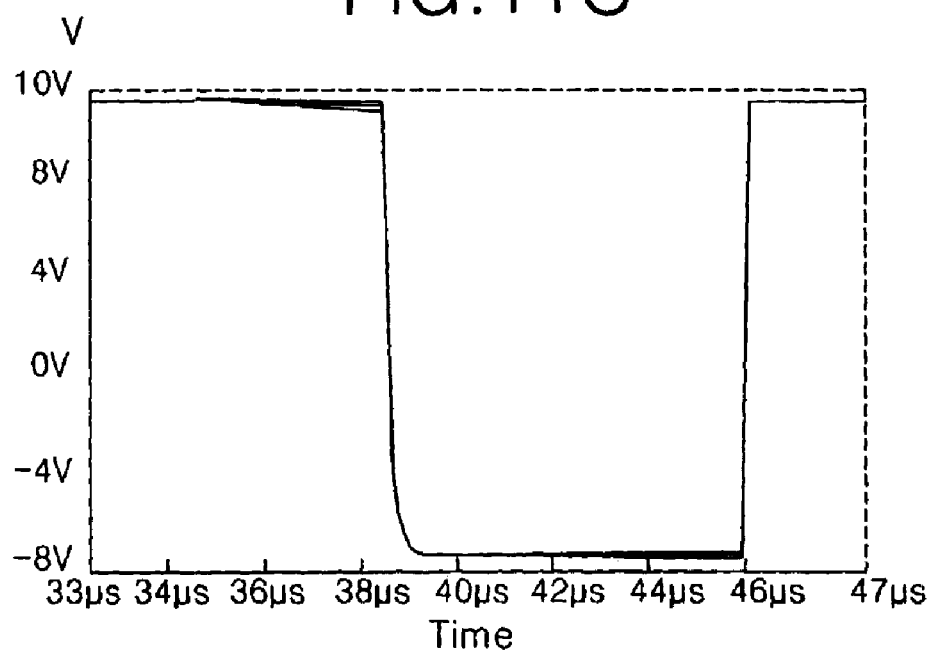

Referring to FIG. 11A, by making the channel width of the PMOS transistors T15, T8A, T8B, and T9 narrow, the static current consumed by the current path CP is reduced by about 1/10 as compared with the shift register shown in FIG. 6. Accordingly, the total power dissipation consumed in the shift register shown in FIG. 9 can be improved by at least about 60% compared with the shift register shown in FIG. 6. A dynamic current shown in FIG. 11A represents the current generated whenever the shift register shown in FIG. 9 applies a high state output signal LO. Referring to FIG. 11B, when the channel width, W, of the ninth PMOS transistor T9 shown in FIG. 9 decreases from about 700⊠ m to about 50⊠ m, there is almost no change in current dissipation. Referring to FIG. 11C, when the channel width, W, of the ninth PMOS transistor T9 shown in FIG. 9 decreases from about 700⊠ m to about 400⊠ m and to about 100⊠ m, the waveform of the output signal LO remains substantially undistorted.

According to the principles of the present invention, the channel widths of PMOS transistors T15, T8A, T8B, and T9 forming the current path may be reduced to minimize the consumption and the dissipation of the static current.

In one aspect of the present invention, the high state output signal LO may be outputted during second and third periods of time, t2 and t3, when voltages of the first and second clock signals C1 and C2 represent the high state because the tenth and twelfth PMOS transistors T10 and T12 are controlled by the third clock signal C3. Accordingly, output signals LO outputted for example, during the second period of time, t2, having otherwise undesirable falling time characteristics may be overlapped with a stable high state output signal from a preceding level shifter (not shown). Further, the output signal LO generated during, for example, the third period of time, t3, may be provided as a stable signal representing a high state and be used as a scan signal or a sampling signal.

In one aspect of the present invention, when the tenth and twelfth PMOS transistors T10 and T12 shown in FIG. 9 apply the second clock signal C2, instead of the third clock signal C3, the output signal LO of the level shifter LS and the output signal SO of the stage ST may be represent a high state only during the second period of time, t2.

In another aspect of the present invention, during the third period of time, t3, when the second clock signal C2 represents a high state, the tenth and twelfth PMOS transistors T10 and T12 shown in FIG. 9 input the third clock signal C3, the eleventh PMOS transistor T11 remains in the turned-on state, and the tenth and twelfth PMOS transistors T10 and T12 remain at the turned-off state. Thus, the level shifter LS outputs an output signal LO representing a high state.

However, when the tenth and twelfth PMOS transistors T10 and T12 shown in FIG. 9 input the second clock signal C2, the high state voltage of the second clock signal C2 turns on the tenth and twelfth PMOS transistors T10 and T12 on during the third period of time, t3. Thus, the voltage of output signal LO and at the QL node become discharged and represent a low state. As a result, the level shifter LS, together with the stage ST, outputs an output signal LO representing a high state only during the second period of time, t2, when the tenth and twelfth PMOS transistors T10 and T12 input the second clock signal C2.

Figure 12:
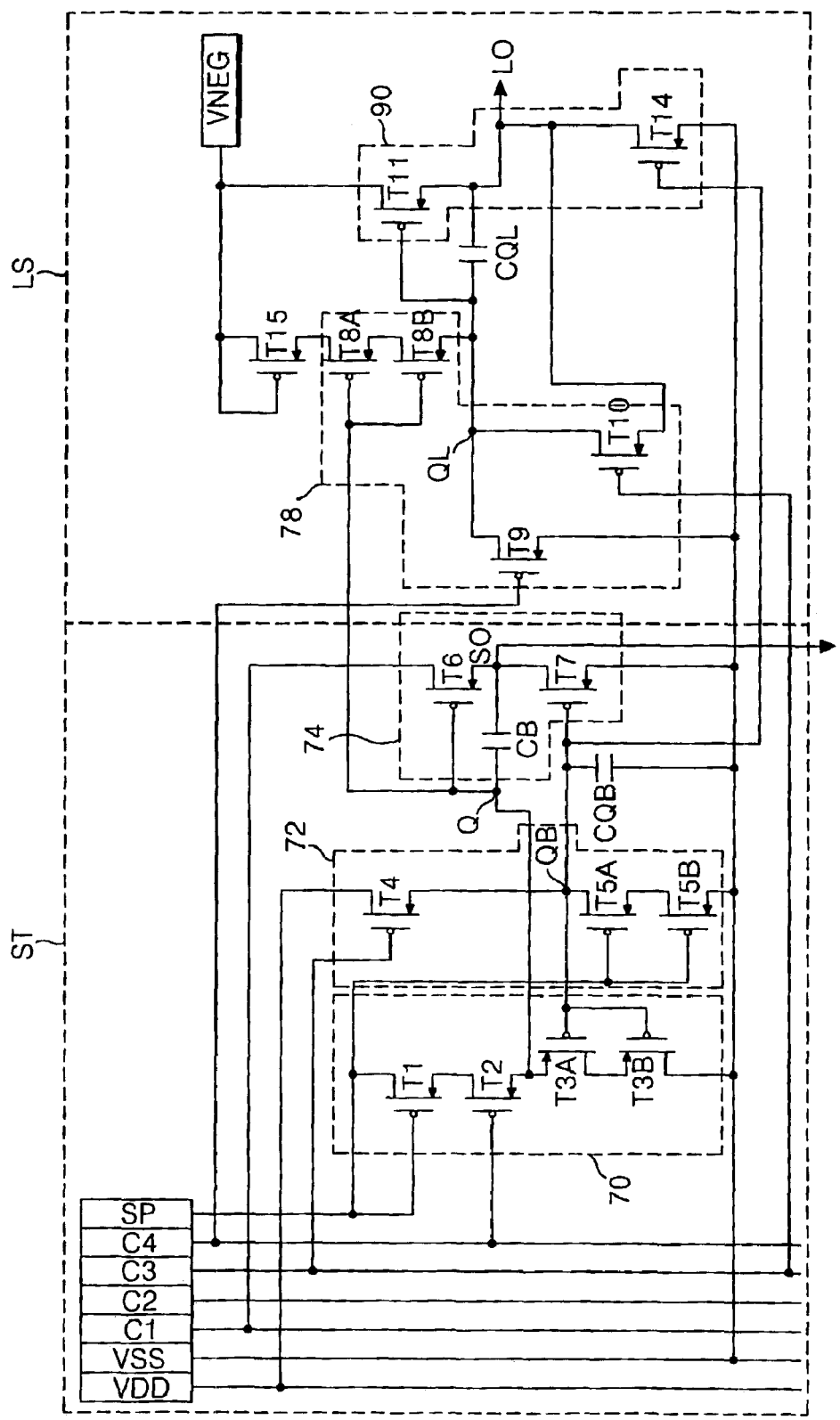
FIG. 12 illustrates a circuit diagram of a shift register incorporating a level shifter in accordance with another aspect of the present invention.

FIG. 12 illustrates a circuit diagram of a shift register incorporating a built-in level shifter in accordance with another aspect of the present invention.

The shift register shown in FIG. 12 may comprise substantially the same components as the shift register shown in FIG. 9, with an exception that the twelfth and thirteenth PMOS transistors T12 and T13 shown in FIG. 9 are eliminated. Accordingly, output part 90 of the level shifter LS may comprise eleventh and fourteenth PMOS transistors T11 and T14, differently from the output part 80 shown in FIG. 9, which comprises the eleventh and twelfth PMOS transistors T11 and T12.

Referring to FIGS. 10 and 12, operations of the shift register of the present aspect will be described in greater detail below.

During a first period of time, t1, the start pulse SP and the fourth clock signal C4 may be synchronized in a high state such that the first and second PMOS transistors T1 and T2 may be turned on and a voltage representing a high state is charged at the Q node. Accordingly, the sixth transistor T6 and the PMOS transistors T8A and T8B, having the gate terminals connected to the Q node, are slowly turned on. Also during the first period of time, t1, the PMOS transistors T5A and T5B may be turned on by the high state voltage of the start pulse SP and charge a low state voltage of 10V, supplied from the first supply voltage VSS input line, to the QB node. Accordingly, the transistors T3A and T3B and the seventh PMOS transistor T7, having the gate terminals connected to the QB node, are turned off. As a result, a low state voltage of 10V is applied from the first clock signal C1 and charged to the output line of the stage ST via the turned-on sixth PMOS transistor T6. Accordingly, the stage ST outputs an output signal SO representing a low state.

In one aspect of the present invention, the negative voltage VNEG may be pre-charged to the QL node through the turned-on transistors T8A and T8B. Accordingly, the fifteenth PMOS transistor T15r may be turned on as a diode by the negative voltage of −8V and the PMOS transistors T8A and T8B may be turned on by the Q node. Because the ninth PMOS transistor T9, turned on by the fourth clock signal C4 representing a high state, may cause the QL node to be discharged to a low state, the eleventh PMOS transistor T11 may be turned off such that the state (i.e., voltage) of the output signal LO of the level shifter LS is maintained.

During a second period of time, t2, the voltages of the start pulse SP and the fourth clock signal C4 are synchronized and represent a low state while the voltage of the first clock signal C1 represents a high state. Accordingly, the first and second PMOS transistors, T1 and T2, respectively, are turned off and the sixth transistor T6 is turned on. Further, an internal parasitic capacitor Cgs (not shown), defined between the gate and the source of the sixth PMOS transistor T6, and the first capacitor CQ induces a bootstrapping phenomenon on the Q node, wherein the Q node is placed in a floating state by the high state voltage of the first clock signal C1. As a result, the sixth transistor T6 is completely turned on so the high state voltage of the first clock signal C1 is rapidly charged to the output line of the stage ST. Accordingly, the stage ST outputs an output signal representing a high state.

Still during the second period of time, t2, the eleventh PMOS transistor T11 is completely turned on because the negative voltage VNEG is charged to the QL node by the fifteenth PMOS transistor T15 and the PMOS transistors T8A and T8B. In one aspect of the present invention, the fifteenth PMOS transistor T15 may be turned on by the negative voltage VNEG while the PMOS transistors T8A and T8B may be completely turned on in accordance with the bootstrapped Q node.

In one aspect of the present invention, an internal parasitic capacitor Cgs (not shown), defined between a gate and source of the eleventh PMOS transistor T11, and the third capacitor CQL may induce a bootstrapping phenomenon at the QL node in addition to the Q node. Thus it is possible to completely turn on the eleventh transistor T11. A negative voltage VNEG may be charged to the output line of the level shifter LS through the completely turned-on eleventh PMOS transistor T11 such that the level shifter LS outputs an output signal LO representing a high state. In one aspect of the present invention, the fifteenth PMOS transistor T15, connected as a diode, has a narrow channel width to prevent the leakage current at the PMOS transistors T8A and T8B. In another aspect of the present invention, if the threshold voltage of the PMOS transistors T8A and T8B is low and leakage current of the PMOS transistors T8A and T8B causes the voltage in the QL node to be discharged to a low state. Accordingly, it is possible to prevent the output signal LO of the level shifter LS from being distorted.

During a third period of time, t3, a voltage of the first clock signal C1 represents a low state while a voltage of the second clock signal C2 represents a high state. Accordingly, a voltage at the Q node drops down to about 2V such that the Q node represents a low level high state while the sixth transistor T6 remains turned-on. Thus, a low state voltage of 10V is charged by the first clock signal C1 to the output line of stage ST. Accordingly, the stage ST may output an output signal SO representing a low state. In one aspect of the present invention, the negative voltage VNEG may be charged to the QL node via the fifteenth PMOS transistor T15, turned on by a negative voltage VNEG of about −8V, and the PMOS transistors T8A and T8B, turned on by the Q node. Thus, the eleventh PMOS transistor T11 may remain in a turned-on state and the negative voltage VNEG may be charged to the output line of the level shifter LS via the turned-on eleventh PMOS transistor T11. As a result, the level shifter LS may output an output signal LO representing a high state.

During a fourth period of time, t4, a voltage of the third clock signal C3 represents a high state. Accordingly, the fourth PMOS transistor T4 may be turned on to charge a high state voltage of 0V from the second supply voltage VDD to the QB node. As a result, PMOS transistors T3A, T3B, T7, T10, and T14 are simultaneously turned on. In one aspect of the present invention, the voltage charged at the Q node via the turned-on PMOS transistors T3A and T3B, representing the low level high state, may be discharged to a low state and the sixth PMOS transistor T6 may be turned off. Further, the first supply voltage VSS may be charged to the output line of the stage ST via the turned-on seventh PMOS transistor T7 and the stage ST may output an output signal SO representing a low state.

In one aspect of the present invention, the second capacitor CQB may prevent voltage at the QB node from being distorted by a leakage current from the PMOS transistors T3A, T3B, and T7. In another aspect of the present invention, the voltage at QL node may be discharged to a low state via the turned-on tenth transistor T10, the eleventh transistor T11 may be turned off, and the fourteenth PMOS transistor T14, turned on by high state voltage of the QB node, may apply the first supply voltage VSS to the output line of the level shifter LS. Accordingly, the level shifter LS may output an output signal LO representing a low state.

During a fifth period of time, t5, a voltage of the fourth clock signal C4 represents a high state, the second and ninth PMOS transistors T2 and T9 are turned on, and the PMOS transistors T1, T5A, and T5B remain in a turned-off state, and the voltage at the QB node remains at the previous high state. Accordingly, the PMOS transistors T3A, T3B, and T7 maintain their turned-on states, as in the fourth period of time, t4, and a voltage of the output signal SO of the stage ST remains at the low state. In one aspect of the present invention, a voltage of the output signal LO of the level shifter LS remains at a low state since the fourteenth PMOS transistor T14 is turned-on by the voltage at the QB node representing the high state to apply the first supply voltage VSS representing a low state. In another aspect of the present invention, the eleventh PMOS transistor T11 may be maintained in a turned-off state via the turned-on ninth PMOS transistor T9. Accordingly, an output signal LO of the level shifter LS may be prevented from being distorted by the leakage current from the eleventh PMOS transistor T11.

According to the principles of the present invention, the PMOS transistors T15, T8A, T8B, and T9 illustrated in FIG. 12 form the current path and also control the QL node. Thus, the channel widths of the PMOS transistors T15, T8A, T8B, and T9 can be made narrow, without regard to distorting the waveform of the output signal LO. Accordingly, the static current consumed due to the current path may be reduced by approximately ⅒ compared with the static current consumption of shift registers such as those illustrated in FIG. 6. Further, power dissipation may be improved by at least about 60% compared with the power dissipation characteristics of shift registers such as those illustrated in FIG. 6.

In one aspect of the present invention, the level-shifter LS in the shift register illustrated in FIG. 12 may output signals LO representing a high state during the third period of time, t3, since the tenth PMOS transistor T10 inputs the third clock signal C3.

Figure 13:
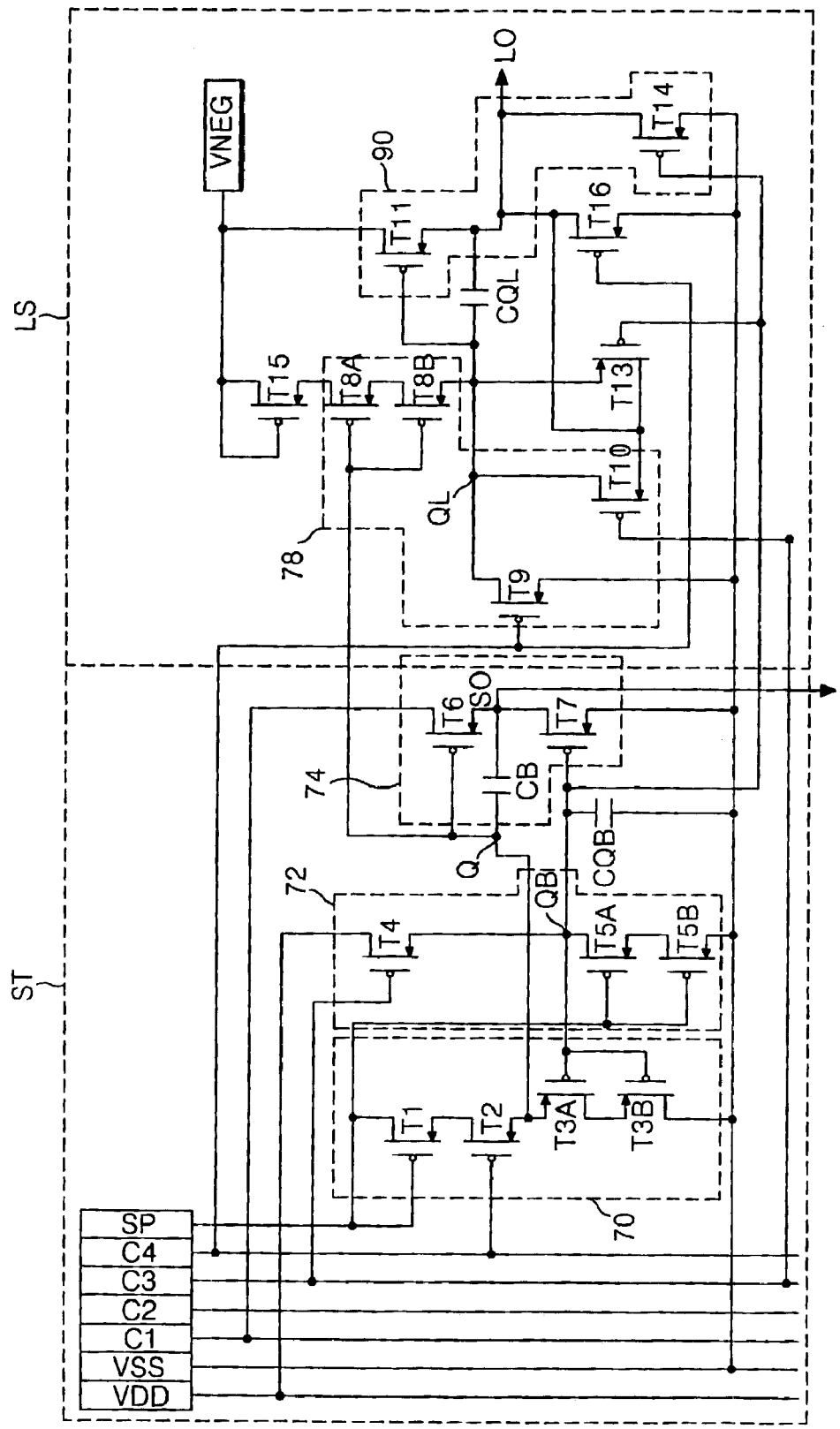
FIG. 13 illustrates a circuit diagram of a shift register incorporating a level shifter in accordance with still another aspect of the present invention.

FIG. 13 illustrates a circuit diagram of a shift register incorporating a built-in level shifter in accordance with yet another aspect of the present invention.

The shift register shown in FIG. 13 may comprise substantially the same components as the shift register shown in FIG. 12, with an exception that thirteenth and sixteenth PMOS transistors T13 and T16 are added.

Referring to FIGS. 10 and 13, operations of the shift register of the present aspect will be described in greater detail below.

During a first period of time, t1, the start pulse SP and the fourth clock signal C4 may be synchronized in a high state such that the first and second PMOS transistors T1 and T2 may be turned on and a voltage representing a high state is charged at the Q node. Accordingly, the sixth transistor T6 and the PMOS transistors T8A and T8B, having the gate terminals connected to the Q node, are slowly turned on. Also during the first period of time, t1, the PMOS transistors T5A and T5B may be turned on by the high state voltage of the start pulse SP and charge a low state voltage of 10V, supplied from the first supply voltage VSS input line, to the QB node. Accordingly, the transistors T3A and T3B and the seventh PMOS transistor T7, having the gate terminals connected to the QB node, are turned off. As a result, a low state voltage of 10V is applied from the first clock signal C1 and charged to the output line of the stage ST via the turned-on sixth PMOS transistor T6. Accordingly, the stage ST outputs an output signal SO representing a low state.

In one aspect of the present invention, the negative voltage VNEG may be pre-charged to the QL node through the turned-on transistors T8A and T8B. Accordingly, the fifteenth PMOS transistor T15 may be turned on as a diode by the negative voltage of −8V and the PMOS transistors T8A and T8B may be turned on by the Q node. Because the ninth and sixteenth PMOS transistors T9 and T16, turned on by the fourth clock signal C4 representing a high state, the output signal LO of the level shifter LS and the QL node are discharged to a low state.

During a second period of time, t2, the voltages of the start pulse SP and the fourth clock signal C4 are synchronized and represent a low state while the voltage of the first clock signal C1 represents a high state. Accordingly, the first and second PMOS transistors, T1 and T2, respectively, are turned off and the sixth transistor T6 is turned on. Further, an internal parasitic capacitor Cgs (not shown), defined between the gate and the source of the sixth PMOS transistor T6, and the first capacitor CQ induces a bootstrapping phenomenon on the Q node, wherein the Q node is placed in a floating state by the high state voltage of the first clock signal C1. As a result, the sixth transistor T6 is completely turned on so the high state voltage of the first clock signal C1 is rapidly charged to the output line of the stage ST. Accordingly, the stage ST outputs an output signal representing a high state.

Still during the second period of time, t2, the eleventh PMOS transistor T11 is completely turned on because the negative voltage VNEG is charged to the QL node by the fifteenth PMOS transistor T15 and the PMOS transistors T8A and T8B. In one aspect of the present invention, the fifteenth PMOS transistor T15 may be turned on by the negative voltage VNEG while the PMOS transistors T8A and T8B may be completely turned on in accordance with the bootstrapped Q node.

In one aspect of the present invention, an internal parasitic capacitor Cgs (not shown), defined between the gate and source of the eleventh PMOS transistor T11, and the third capacitor CQL may induce a bootstrapping phenomenon at the QL node in addition to the Q node. Thus it is possible to completely turn on the eleventh transistor T11. A negative voltage VNEG may be charged to the output line of the level shifter LS through the completely turned-on eleventh PMOS transistor T11 such that the level shifter LS outputs an output signal LO representing a high state. In one aspect of the present invention, the fifteenth PMOS transistor T15 may prevent the leakage current at the PMOS transistors T8A and T8B. In anther aspect of the present invention, the threshold voltage of the PMOS transistors T8A and T8B is low and leakage current of the PMOS transistors T8A and T8B causes the voltage in the QL node to be discharged to a low state. Accordingly, it is possible to prevent the output signal LO of the level shifter LS from being distorted.

During a third period of time, t3, a voltage of first clock signal C1 represents a low state while a voltage of the second clock signal C2 represents a high state. Accordingly, a voltage at the Q node drops down to about 2V such that at the Q node represents a low level high state and the sixth transistor T6 remains turned-on. Thus, a low state voltage of 10V is charged by the first clock signal C1 to the output line of the stage ST. Accordingly, the stage ST may output an output signal SO representing a low state. In one aspect of the present invention, the negative voltage VNEG may be charged to the QL node via the fifteenth PMOS transistor T15, turned on by a negative voltage VNEG of about −8V, and the PMOS transistors T8A and T8B, turned on by the Q node. Thus, the eleventh PMOS transistor T11 may remain in a turned-on state and the negative voltage VNEG may be charged to the output line of the level shifter LS via the turned-on eleventh PMOS transistor T11. As a result, the level shifter LS may output an output signal LO representing a high state.

During a fourth period of time, t4, a voltage of the third clock signal C3 represents a high state. Accordingly, the fourth PMOS transistor T4 may be turned to charge a high state voltage of 0V from the second supply voltage VDD to the QB node. As a result, PMOS transistors T3A, T3B, T7, T13, and T14 are simultaneously turned-on. In one aspect of the present invention, the tenth PMOS transistor T10 may be turned on by the voltage of the third clock signal C3 representing a high state. In another aspect of the present invention, the voltage charged at the Q node via the turned-on PMOS transistors T3A and T3B, representing the low level high state, may be discharged to a low state and the sixth PMOS transistor T6 may be turned off. Further, the first supply voltage VSS may be charged to the output line of the stage ST via the turned-on seventh PMOS transistor T7 and the stage ST may outputs an output signal SO representing a low state.

In one aspect of the present invention, the second capacitor CQB may prevent a voltage at the QB node from being distorted by a leakage current from the PMOS transistors T3A, T3B, and T7. In another aspect of the present invention, the voltage at QL node may be discharged to a low state via the turned-on tenth and thirteenth transistors T10 and T13, the eleventh transistor T11 may be turned off, and, the fourteenth PMOS transistor T14, turned on by a voltage at the QB node representing a high state, may apply the first supply voltage VSS to the output line of the level shifter LS. Accordingly, the level shifter LS may outputs an output signal LO representing the low state.

During a fifth period of time, t5, a voltage of the fourth clock signal C4 represents a high state, the second, ninth, and sixteenth PMOS transistors T2, T9, and T16 are turned on, the PMOS transistors T1, T5A, and T5B remain in a turned-off state, and the voltage at the QB node remains at the previous high state. Accordingly, the PMOS transistors T3A, T3B, and T7 maintain their turned-on states, as in the fourth period of time, t4, and a voltage of the output signal SO of the stage ST remains at the low state. In one aspect of the present invention, a voltage of the output signal LO of the level shifter LS remains at a low state since the fourteenth PMOS transistor T14 is turned on by the voltage at the QB node representing the high state and the sixteenth PMOS transistor T16 is turned on by the voltage of the fourth clock signal C4 representing the high state to apply the first supply voltage VSS representing a low state. In another aspect of the present invention, the eleventh PMOS transistor T11 may be maintained in a turned-off state via the turned-on ninth and thirteenth PMOS transistors T9 and T13. Accordingly, the output signal LO of the level shifter LS may be prevented from being distorted by the leakage current from the eleventh PMOS transistor T11.

According to the principles of the present invention, the PMOS transistors T15, T8A, T8B, and T9 illustrated in FIG. 13, form the current path and also control the QL node. Thus, the channel widths of the PMOS transistors T15, T8A, T8B, and T9 can be made narrow, without regard to distorting the waveform of the output signal LO. Accordingly, the static current consumed due to the current path may be reduced by approximately 1/10 compared with the static current consumption of shift registers such as those illustrated in FIG. 6. Further, power dissipation may be improved by at least about 60% compared with the power dissipation characteristics of shift registers such as those illustrated in FIG. 6.

In one aspect of the present invention, after the second period of time, t2, the shift register shown in FIG. 13 can be operated during overlap driving by outputting an output signal LO representing a high state during, for example, the third period of time, t3, since the tenth PMOS transistor T10 inputs the third clock signal C3.

In accordance with the principles of the present invention, the shift register incorporating a built-in level shifter allows PMOS transistors T15, T8A, T8B, and T9 to form a current path and to indirectly control an output signal via the QL node. It is thus possible to reduce the channel widths of the PMOS transistors T15, T8A, T8B, and T9 without regard to waveform distortion of the output signal. Accordingly, the static current consumption caused by the current path can be reduced by at least 1/10 as compared with shift registers such as those shown in FIG. 6 such that the power dissipation can be improved by at least 60% as compared with shift registers such as those shown in FIG. 6.

Lastly, the shift register incorporating the built-in level shifter of the present invention may be used with gate drivers as well as with data drivers of display panels (e.g., liquid crystal display panels, EL display devices, etc.) fabricated using polycrystalline silicon. Further, the shift register of the present invention can be fabricated in the display panel concurrently during fabrication of a pixel matrix. Still further, swing widths of clock signals and start pulses applied to the display panel and power dissipation of the level shift may be reduced. Accordingly, the overall power dissipation of the display panel may be reduced.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A shift register incorporating a built-in level shifter, comprising:

n number of stages connected in cascade to an input terminal of a start pulse, wherein each state receives an input pulse, shifts the received input pulse and outputs an output pulse, wherein the output pulse includes the shifted input pulse, wherein the input pulse of a first one of the n number of stages includes the start pulse, and wherein the input pulse of the second to $n^{th}$ stages includes the output pulse of a preceding one of the first to $n-1^{th}$ stages, respectively; and a plurality of level shifters for level-shifting voltage levels of the output pulses of each of the stages and for outputting the output pulses having the level-shifted voltage levels, wherein each of the stages comprises:

a buffer for outputting an output pulse using a first clock signal and a first supply voltage in accordance with voltages at a first node and a second node;

a first controller for controlling the voltage of the first node in accordance with an input pulse and the second node; and a second controller for controlling the voltage of the second node using the first supply voltage and a second supply voltage in accordance with the input pulse and a second clock signal, and wherein each of the level shifters comprises:

a third controller for forming a current path between an input line of a third supply voltage and an input line of the first supply voltage and for controlling a third node using the first supply voltage and the third supply voltage in accordance with the voltage of the second node and two clock signals selected from the group consisting of second to fourth clock signals; and an output part for outputting an output pulse having a level-shifted voltage level using the first and third supply voltages in accordance with a state of the voltage at the third node.

2. The shift register according to claim 1, wherein the first controller of each stage comprises:

a first transistor having a first conduction path between an input line of the input pulse and the first node and having a first control electrode for controlling the first conduction path in accordance with the input pulse;

a second transistor having a second conduction path between an output terminal of the first transistor and the first node, and having a second control electrode for controlling the second conduction path in accordance with a third clock signal; and a third transistor having a third conduction path between the first node and the input line of the first supply voltage, and having a third control electrode for controlling the third conduction path in accordance with the voltage of the second node.

3. The shift register according to claim 2, wherein the third transistor is a dual transistor comprising a dual control electrode for controlling the third conduction path in accordance with the voltage of the second node.

4. The shift register according to claim 2, wherein the second controller of each stage comprises:

a fourth transistor having a fourth conduction path between an input line of the second supply voltage and the second node, and having a fourth control electrode for controlling the fourth conduction path in accordance with the second clock signal; and a fifth transistor having a fifth conduction path between the second node and the input line of the first supply voltage, and having a fifth control electrode for controlling the fifth conduction path in accordance with the input pulse.

5. The shift register according to claim 4, wherein the fifth transistor is a dual transistor comprising a dual control electrode for controlling the fifth conduction path in accordance with the input pulse.

6. The shift register according to claim 4, wherein the buffer of each stage comprises:

a sixth transistor having a sixth conduction path between an input line of the first clock signal and an output line of the respective stage, and a sixth control electrode for controlling the sixth conduction path in accordance with the voltage of the first node; and a seventh transistor having a seventh conduction path between the output line of the respective stage and the input line of the first supply voltage, and having a seventh control electrode for controlling the seventh conduction path in accordance with the voltage of the second node.

7. The shift register according to claim 6, wherein the buffer of each stage comprises a capacitor connected between the control electrode of the sixth transistor and the output line of the stage for bootstrapping the voltage of the sixth control electrode.

8. The shift register according to claim 6, wherein each stage wherein each stage further comprises a capacitor for preventing the voltage of the second node from being distorted by a leakage current of the fifth transistor.

9. The shift register according to claim 6, wherein the third controller of each level shifter comprises:

an eighth transistor having an eighth conduction path between the input line of the third supply voltage and the third node, and an eighth control electrode for controlling the eighth conduction path in accordance with the voltage of the first node;

a ninth transistor having a ninth conduction path between the third node and the input line of the first supply voltage, and a ninth control electrode for controlling the ninth conduction path in accordance with the third clock signal; and a tenth transistor having a tenth conduction path between the third node and an output line of the respective level shifter, and a tenth control electrode for controlling the tenth conduction path in accordance with the second clock signal or the fourth clock signal.

10. The shift register according to claim 9, wherein the eighth transistor is a dual transistor comprising a dual control electrode for controlling the eighth conduction path in accordance with the voltage of the first node.

11. The shift register according to claim 9, wherein the output part of each level shifter comprises:

an eleventh transistor having an eleventh conduction path between the input line of the third supply voltage and the output line of the respective level shifter, and having an eleventh control electrode for controlling the eleventh conduction path in accordance with the voltage of the third node; and a twelfth transistor having a twelfth conduction path between the output line of the level shifter and the input line of the first supply voltage, and having a twelfth control electrode for controlling the twelfth conduction path in accordance with the second clock signal or the fourth clock signal.

12. The shift register according to claim 11, wherein the output part of each level shifter comprises a capacitor connected between the control electrode of the eleventh transistor and the output line of the respective level shifter for bootstrapping the voltage of the eleventh control electrode.

13. The shift register according to claim 11, wherein level shifter partially overlaps with a preceding level shifter and outputs an output pulse having a level-shifted voltage level when the tenth transistor and the twelfth transistor are controlled by the second clock signal.

14. The shift register according to claim 11, wherein each level shifter is synchronized with a respective output pulse and outputs an output pulse having a level-shifted voltage level when the tenth transistor and the twelfth transistor are controlled by the fourth clock signal.

15. The shift register according to claim 11, wherein each level shifter further comprises:

a thirteenth transistor having a thirteenth conduction path between the third node and the output line of the level shifter, and having a thirteenth control electrode for controlling the thirteenth conduction path in accordance with the voltage of the second node.

16. The shift register according to claim 15, wherein each level shifter further comprises:

a fourteenth transistor having a fourteenth conduction path between the output line of the level shifter and the input line of the first supply voltage, and having a fourteenth control electrode for controlling the fourteenth conduction path in accordance with the voltage of the second node.

17. The shift register according to claim 16, wherein each level shifter further comprises:

a fifteenth transistor connected as a diode between the input line of the third supply voltage and the eighth transistor.

18. The shift register according to claim 9, wherein the output part of each level shifter comprises:
- an eleventh transistor having an eleventh conduction path between the input line of the third supply voltage and the output line of a respective level shifter, and having an eleventh control electrode for controlling the eleventh conduction path in accordance with the voltage of the third node; and
- a twelfth transistor having a twelfth conduction path between the output line of the respective level shifter and the input line of the first supply voltage, and having a twelfth control electrode for controlling the twelfth conduction path in accordance with the voltage of the second node.

19. The shift register according to claim 18, wherein the output part of each level shifter comprises a capacitor connected between the control electrode of the eleventh transistor and the output line of the respective level shifter for bootstrapping the voltage of the eleventh control electrode.

20. The shift register according to claim 18, wherein each level shifter further comprises:
- a thirteenth transistor having a thirteenth conduction path between the third node and the output line of the respective level shifter, and having a thirteenth control electrode for controlling the thirteenth conduction path in accordance with the voltage of the second node.

21. The shift register according to claim 20, wherein the level shifter further comprises a fifteenth transistor connected as a diode between the input line of the third supply voltage and the eighth transistor.

22. The shift register according to claim 21, wherein each level shifter further comprises a sixteenth transistor having a sixteenth conduction path between the output line of the respective level shifter and the input line of the first supply voltage, and having a sixteenth control electrode for controlling the conduction path in accordance with the third clock signal.

23. The shift register according to claim 1, wherein the first supply voltage is greater than the second supply voltage and wherein the second supply voltage is greater than the third supply voltage.

24. The shift register according to claim 1, wherein the third supply voltage comprises a negative voltage.

25. The shift register according to claim 1, wherein the first to fourth clock signals comprise clock signals with phases delayed by one clock signal in order of the fourth clock signal, the first clock signal, the second clock signal, and the third clock signal and wherein the fourth clock signal and the start pulse are synchronized with each other.

26. The shift register according to claim 1, wherein the stages and the level shifters comprise thin film transistors having only a single channel type.

27. The shift register according to claim 1, wherein the stages and the level shifters comprise only P-channel thin film transistors.

28. The shift register according to claim 1, wherein the level shifter lowers the minimum voltage level of the shifted pulse to the third supply voltage and outputs the level shifted pulse.

29. The shift register according to claim 1, wherein the shift register is applied to at least one of a gate driver driving gate lines of a display device and a data driver driving data lines of the display device.

* * * * *